United States Patent [19]
Lingren et al.

[11] Patent Number: 6,046,454
[45] Date of Patent: *Apr. 4, 2000

[54] SEMICONDUCTOR RADIATION DETECTOR WITH ENHANCED CHARGE COLLECTION

[75] Inventors: Clinton L. Lingren, San Diego; Jack F. Butler, La Jolla; Boris Apotovsky, San Diego; Richard L. Conwell, Del Mar; F. Patrick Doty, San Diego; Stanley J. Friesenhahn, Poway, all of Calif.

[73] Assignee: Digirad Corporation, San Diego, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/943,492

[22] Filed: Oct. 3, 1997

Related U.S. Application Data

[63] Continuation of application No. 08/881,175, Jun. 23, 1997, abandoned, which is a continuation-in-part of application No. 08/542,883, Oct. 13, 1995, Pat. No. 5,677,539.

[51] Int. Cl.[7] .................................................. G01T 1/24
[52] U.S. Cl. ........................... 250/370.01; 250/370.13; 250/385.1
[58] Field of Search ................... 250/370.13, 370.01, 250/385.1, 374

[56] References Cited

U.S. PATENT DOCUMENTS

| | | |
|---|---|---|
| 3,761,711 | 9/1973 | Hall . |
| 4,255,659 | 3/1981 | Kaufman et al. . |
| 4,469,945 | 9/1984 | Hoeberechts et al. ............. 250/370.01 |
| 4,583,020 | 4/1986 | Cliquet et al. ........................ 250/374 |
| 4,692,782 | 9/1987 | Seki et al. . |
| 4,782,377 | 11/1988 | Mahan . |
| 4,837,607 | 6/1989 | Kemmer et al. . |
| 5,227,635 | 7/1993 | Iwanczyk . |
| 5,391,882 | 2/1995 | Rhiger . |

FOREIGN PATENT DOCUMENTS

| | | |
|---|---|---|
| 62-293680 | 12/1987 | Japan . |
| 1-138486 | 5/1989 | Japan . |
| 2-105090 | 4/1990 | Japan . |

OTHER PUBLICATIONS

Hecht, K., "Zum Mechanismus des lichtelektrischen Primarstromes in isolierenden Kristallen", *Z. Physics*, vol. 77, at p. 235, 1932.

Zanio, K., et al., "Performance of CdTe as a Gamma Spectrometer and Detector," *IEEE Trans. Nucl. Sci.*, vol. 17, pp. 287–295, 1970.

Malm, H.L., et al., "Gamma-Ray Spectroscopy with Single-Carrier Collection in High-Resistivity Semiconductor", *App. Phys. Let.*, vol. 26, No. 6, pp. 344–346, Mar. 1975.

(List continued on next page.)

Primary Examiner—Constantine Hannaher
Assistant Examiner—Darren M. Jiron
Attorney, Agent, or Firm—Fish & Richardson P.C.

[57] ABSTRACT

A radiation detector for detecting ionizing radiation. The detector includes a semiconductor having at least two sides. A bias electrode is formed on one side of the semiconductor. A signal electrode is formed on a side of the semiconductor and is used to detect the energy level of the ionizing radiation. A third electrode (the control electrode) is also formed on the semiconductor. The control electrode shares charges induced by the ionizing radiation with the signal electrode, shielding the signal electrode until the charge clouds are close to the signal electrode. The control electrode also alters the electric field within the semiconductor, such that the field guides the charge clouds toward the signal electrode when the clouds closely approach the signal electrode. As a result, signal loss due to trapped charge carriers (i.e., electrons or holes) is minimized, and low-energy tailing is virtually eliminated. A fourth electrode can be added to separate the charge-shielding and field shaping functions of the control electrode. More electrodes can be added to further enhance both functions. The invention can be used in several cross-strip detector configurations, in a side-entry radiation detector, and with liquid/gas ionization detectors.

26 Claims, 20 Drawing Sheets

OTHER PUBLICATIONS

Malm, et al., "Single Carrier Charge Collection in Semiconductor Nuclear Detectors", *Revue de Physique Appliquee,* vol. 12, No. 2, Feb. 1977.

Zanio, K., "Use of Various Device Geometry to Improve the Performance of CdTe Detectors", *Revue de Physique Appliquee,* No. 12, Feb. 1977.

Gatti, E., et al., "Semiconductor Drift Chamber—An Application of a Novel Charge Transport Scheme", *Nucl. Instruments and Methods in Physics Research,* 225, pp. 608–614, 1984.

Richter, M., et al., "High Resolution Gamma Ray Spectroscopy with CdTe Detector System", *Nucl. Instruments and Methods in Physics Research,* A322, pp. 529–537, 1982.

Doty, F.P., et al., "Pixellated CdZnTe Detector Arrays" *Nucl. Instruments and Methods in Physics Research,* A00, 1994.

Jalas, P., et al., "New Results in Semiconductor Drift Chambers for X–Ray Spectroscopy", *IEEE Trans. Nucl. Sci.,* vol. 41, No. 4, p. 148, Aug. 1994.

Luke, P.N., "Unipolar Charge Sensing with Coplanar Electrode—Application to Semiconductor Detectors", *IEEE Trans. Nucl. Sci.,* vol. 42, No. 4, pp. 207–213, 1995.

Barrett, H.H., et al., "Charge Transport in Rays of Semiconductor Gamma–Ray Detectors", *Physical Review Letters,* vol. 75, No. 2, pp. 156–159, Jul. 3, 1995.

Ivanov, V.I., "Spectrometric Characteristics Improvement of CdTe Detectors," *IEEE Trans. Nucl. Sci.,* vol. 42, No. 4, pp. 258–262, Aug. 1995.

SEMICONDUCTOR RADIATION DETECTOR WITH ENHANCED CHARGE COLLECTION

CROSS-REFERENCE TO RELATED APPLICATIONS

This application is a continuation of U.S. patent application Ser. No. 08/881,175, filed Jun. 23, 1997, now abandoned which is a continuation-in-part of U.S. patent application Ser. No. 08/542,883, filed Oct. 13, 1995, now U.S. Pat. No. 5,677,539.

BACKGROUND

1. Field of the Invention

This invention relates to a device and method for detecting ionizing radiation, and more particularly to a semiconductor radiation detector with enhanced charge collection for reducing low-energy tailing effects.

2. Description of Related Art

High-resistivity semiconductor radiation detectors are widely used for detecting ionizing radiation due to their ability to operate at room temperature, their small size and durability, and other features inherent in semiconductor devices. Such detectors are used in a wide variety of applications, including medical diagnostic imaging, nuclear waste monitoring, industrial process monitoring, and space astronomy. Ionizing radiation includes both particulate radiation, such as alpha or beta particles, and electromagnetic radiation, such as gamma or x rays.

Conventional semiconductor radiation detectors are generally referred to as "planar" detectors. As shown in FIG. 1, the architecture of such planar detectors 100 typically consists of a slab of semiconductor crystal 102 with metal covering two opposing surfaces of the slab to form two electrodes, a cathode 104 and an anode 106. In one configuration, the anode 106 is connected to external signal conditioning circuitry 108 and to ground 110, and the cathode 104 is connected to an external voltage source 111. A bias voltage across the electrodes 104, 106 creates an internal electric field. Electron and hole "charge clouds" generated within the semiconductor crystal 102 by an ionizing radiation 112 absorbed within the slab of semiconductor crystal 102 are swept toward the anode 106 and cathode 104 electrodes, respectively. These moving electron and hole clouds create charge-pulse signals in the external signal conditioning circuitry 108.

If all the electrons and holes generated by the ionizing radiation 112 reach their respective electrodes (i.e., the electrons reach the anode 106 and the holes reach the cathode 104), the output charge signal will exactly equal the charge from the energy deposited within the crystal 102. Because the deposited charge is directly proportional to the energy of the ionizing radiation 112, the semiconductor radiation detector 100 provides a means for measuring the energy of the ionizing radiation 112. The ability to measure this energy is an important function of radiation detectors.

Planar radiation detectors, however, suffer from a serious drawback: because of limitation in the transport properties of the bulk semiconductor crystal 102, some of the electrons and holes are generally lost by being trapped as they sweep toward their respective electrodes. Thus, the amplitude of the output charge signal becomes dependent on the position within the crystal at which the ionizing radiation is absorbed. Generally, the amplitude is less than the charge deposited by the ionizing radiation 112, resulting in a corresponding reduction of energy measurement accuracy as well as poor resolution and reduced peak efficiency. This loss (or trapping) of charge in a radiation detector results in asymmetrical spectral peak shapes known as "low-energy tailing."

As stated above, in a semiconductor radiation detector, when an ionizing event occurs, electrons are swept toward the anode 106 and holes toward the cathode 104. In a typical experimental arrangement, with the cathode 104 facing the source of the radiation, many ionization events occur over some accumulation period, and the resulting charge signal pulses are detected and then displayed in a histogram. In an ideal detector, in which there is no low-energy tailing, all the pulses would be directly proportional to the energy of the ionizing radiation 112. This would result in a histogram like that of FIG. 2, in which counts per channel are plotted versus charge signal pulse amplitude. As can be seen in FIG. 2, the energy histogram exhibits no tailing, because the energy peak (or "photopeak") 202 appears as a straight vertical line at a single energy level, E, equal to the energy level of the ionizing radiation 112. Thus, all the charge signal pulses have an amplitude equal to the energy level E of the ionizing radiation 112, and no charge is lost in any single pulse.

Curves A and B of FIG. 3 illustrate two idealized cases of low-energy tailing in a non-ideal detector. Curve A represents the histogram distribution that would result if the ionizing radiation were absorbed uniformly throughout the crystal, as would occur with a very low absorption coefficient of the crystal. Curve B represents the more typical situation, where absorption is large near the cathode and drops off exponentially as the ionizing event moves in a direction away from the cathode within the crystal. In both Curves A and B, there is a maximum signal 302 corresponding to full charge collection (at amplitude "E") and pronounced low-energy "tails" 304, 306.

FIG. 4 shows an energy histogram exhibiting pronounced low-energy tailing for an actual semiconductor radiation detector made from Cadmium-Zinc-Telluride (CdZnTe) irradiated with gamma rays from a cobalt-57 ("$^{57}$Co") radiation source. This detector had area dimensions of 6.1 mm by 6.1 mm and a thickness of 3 mm. Its bias voltage was −500 Volts. The data values in FIG. 4 are spread-out by electronic noise, an effect that was not considered in plotting the idealized curves of FIG. 3. As with Curves A and B of FIG. 3, the histogram of FIG. 4 has a pronounced low-energy tail 404.

Because of the deleterious effects of low-energy tailing in semiconductor detectors, much effort has gone into attempting to solve this problem. One approach to reducing the tailing effect in semiconductor detectors is to reduce the dependence of the signal pulse-charge amplitude on the position at which the ionizing radiation is absorbed. This can be accomplished, in principle, by contriving to limit to a small distance the region in which charge is induced on one electrode by a charge cloud in front of that electrode. If this is accomplished, a charge cloud generated by an ionizing event induces little charge on the electrode until it becomes very near the electrode, after which the charge cloud induces essentially all of its charge on that electrode. This approach is especially useful for semiconductors in which the transport properties of one carrier type (e.g., electrons) are much better than those of the other type (holes in this example). These transport properties are expressed by a "mobility-lifetime product." The ratio of the transport properties of one type carrier (e.g., holes) to those of the other type carrier (e.g., electrons) is expressed as the "mobility-lifetimeproduct ratio." Thus, the general approach described above is useful for all mobility-lifetime-product ratios, but is most useful for semiconductors having a large ratio of the larger mobility-lifetime product divided by the smaller. Semiconductors for which the mobility-lifetime-product ratio is greater than 10 include cadmium-zinc-telluride, cadmium-telluride, and mercury-iodide.

An early effort aimed at minimizing low-energy tailing using the above approach employed a semiconductor detector having a hemispherical configuration. See, e.g., H. L. Malm, et al., "Gamma-Ray Spectroscopy with Single-Carrier Collection in High Resistivity Semiconductors," Appl. Phys. Lett., vol. 26, at 344–46 (1975). In Malm's detector, a large hemispherical surface of the cadmium-telluride was metallized to form the cathode. The anode formed a small circle at the center of the flat cross-section of the hemisphere. A bias voltage applied across these electrodes produced an internal electric field that varied from a low value near the cathode to a high value near the small anode. The electric field lines were thus concentrated near the central point by the spherical geometry. A result of this electric field concentration is that electrons move much faster in the close vicinity of the anode than in the remainder of the detector. Because the charge induced on the anode is inversely proportional to the square of the distance from the charge cloud to the anode, most of the charge is induced when the charge cloud is in the vicinity of the anode. The signal charge pulse amplitude is thus relatively insensitive to the position of the ionizing event in the detector.

The Malm approach, however, has several disadvantages. First, while energy resolution is improved over the planar detector, significant tailing remains. Second, it is difficult and thus costly to fabricate a semiconductor crystal having a hemispherical configuration. Third, the configuration cannot be applied to monolithic detector array structures. In consequence, this detector has achieved little, if any, commercial acceptance.

A second approach achieves a reduction in tailing by using a planar structure in which the anode is in two sections, a 0.5 mm diameter circle and a ring surrounding and at the same voltage as the circle, and the cathode covers the opposite surface. See, e.g., F. P. Doty, et al., "Pixilated CdZnTe Detector Arrays," Nucl. Instruments & Methods in Physics Research, vol. A 353, at 356–60 (1994). The charge induced by an electron cloud is shared between the small circle and the ring, such that the charge induced on the circle is very small until the charge comes very close to the circle. The full charge is then induced on the circle within a distance comparable to the pixel dimensions.

This second approach also suffers from a significant disadvantage, in that it results in a very low collection efficiency. This result stems from the fact that only charge clouds directly above the small anode are collected.

A third approach employs a structure in which the anode of a planar CdZnTe detector is segmented into an array of very small individual detectors (pixels), with the cathode remaining as a single, continuous electrode. See H. Barrett, et al., "Charge Transport in Arrays of Semiconductor Gamma-Ray Detectors," Phys. Rev. Let., vol. 75(2), pp. 156–159(1995). Here, each pixel is connected to an external signal conditioning circuit. Charge induced by an electron cloud is shared among the pixels and is very small on any specific pixel until the charge is very near the pixel.

This third approach also suffers from significant limitations. First, it is only useful for an array of very small pixels. Thus, this approach cannot be used for single-element detectors. Second, this approach is not applicable to detector arrays with pixel sizes of a millimeter or more, as used in nuclear medical imagers.

A fourth approach employs an anode patterned into an interleaved grid structure, with the cathode remaining planar. See, e.g., P. N. Luke, "Unipolar Charge Sensing with Co-Planar Electrodes—Application to Semiconductor Detectors," IEEE Tran. Nucl. Science, vol. 42, No. 4, at 207–213 (1995). In the Luke approach, one set of anode grids is maintained at a slightly higher voltage than the other. A train of signal conditioning electronics is connected to each set of grids, and the difference between the outputs from these trains constitutes the final output signal. With this arrangement, when the charge cloud is far from the grids, the difference-signal between the grid outputs is zero. As the cloud approaches the grids, the induced charge on one grid rises rapidly, while the charge induced in the other grid drops rapidly. The difference signal is then a measure of the full charge in the electron cloud, independent of the position of the ionizing event.

The Luke approach, however, also suffers from drawbacks. First, the grid structure is relatively complex and would be difficult, if not impossible, to use in detector arrays. Second, the grids require two separate amplifying chains, plus a difference amplifier, which add significantly to the complexity and cost of manufacture. This circuitry would also be very difficult to implement in multi-channel integrated circuits needed in detector array structures.

A final approach to reducing low-energy tailing may be implicit in the design of silicon drift chambers. See, e.g., E. Gatti & P. Rehak, "Semiconductor Drift Chamber—An Application of a Novel Charge Transport Scheme." Nucl. Inst. & Methods in Physics Research, vol. 225, at 608–614 (1984). A semiconductor drift chamber is based on the principle that a thin, large area semiconductor wafer, with rectifying junctions implanted on both surfaces, can be fully depleted through a small anode contact. The depletion field confines electrons generated by an ionizing particle in a buried potential channel parallel to the surface. An electrostatic field (drift field) parallel to the surface is independently superimposed and transports the electrons along the buried potential channel toward a collecting electrode. In addition, the capacitance of the collecting electrode is very low and independent of the active area of the detector. It has been suggested that drift chambers can be made from a variety of semiconductors. They have been implemented successfully with 300-micron-thick high-resistivity ($10^4$ to $10^5$ ohm-cm) silicon wafers. Such drift chambers are used as high-resolution position-sensing detectors for particle physics.

The silicon drift chamber approach also suffers from several drawbacks. First, rectifying junction contacts must be used to generate the depletion field and the drift field. Because of the limitation of the breakdown voltage of these junction contacts, the magnitude of usable voltage is limited. This in turn limits the thickness of the wafer that can be used for the drift detector. Second, in order to transport charge effectively in the thin channel, a uniform drift field must be applied. A large number of junction contacts, each with a carefully controlled, fixed voltage, is required on the wafer to generate this uniform drift field. This adds significantly to the manufacturing cost and the complexity of using the detector. Third, because of the limitation of the thickness of the detector and the low Z (~14) of the semiconductor material used, the detection efficiency for x rays and gamma rays is very low for energies above 10–20 KeV.

Both silicon detectors and detectors made of high resistivity materials, such as CdTe and CdZnTe, have employed "guard rings" around the signal electrode. A guard ring is normally kept at the same potential as the signal electrode and is used primarily to prevent dark current from the edge of a detector from reaching the signal electrode, thereby reducing the signal-to-noise ratio of the measurement. The guard ring does not significantly reduce low-energy tailing encountered in semiconductor detectors.

Therefore, a need exists for a semiconductor radiation detector that minimizes low-energy tailing and that obviates the disadvantages and drawbacks of conventional radiation detectors. The present invention provides such a radiation detector.

SUMMARY

The invention is a device and method for detecting ionizing radiation emanating from a source. The ionizing radiation may be high energy photons, including gamma rays and x-rays, or charged particles, including beta particles and alpha particles. It should be recognized, however, that the invention may be used in detecting any kind of ionizing radiation.

The invention takes advantage of the principle that a significant reduction in low-energy tailing in a semiconductor detector can be attained by a novel arrangement of electrodes that share induced charge from ionizing events in the detector, that properly shape the electric field, and that focus charge collection toward a small electrode. In implementing a semiconductor radiation detector that follows this principle, the invention employs a detector structure having a novel arrangement of three electrodes that virtually eliminates tailing while maintaining high collection efficiency.

In accordance with the invention, a radiation detector is provided that is capable of detecting energies from a few KeV to several hundred KeV. The detector includes three electrodes formed on the surface of a semiconductor crystal. The crystal has a plurality of sides; it preferably has a thickness of at least about 0.5 mm and is preferably formed from a semiconductor material having a high mobility-lifetime ratio. The first electrode is a bias electrode, which preferably covers the entire surface of one side of the crystal. At least one signal electrode having a small area is preferably formed on the opposing side of the crystal from the bias electrode. A control electrode is preferably disposed on the same side containing the signal electrode.

More particularly, in the invention, the control electrode is formed on the same side of the semiconductor crystal as the signal electrode (or anode), and the bias electrode (or cathode) covers substantially the entire surface of the opposite side of the crystal. Preferably, the semiconductor crystal is formed from CdZnTe or CdTe. In the simplest configuration, the anode is a small contact point located near the center of the electron-charge-collection side of the crystal. The anode is coupled to ground through a large-value resistor and to external signal circuitry. The cathode is coupled to a voltage source that maintains the cathode at a negative voltage level relative to the anode. Preferably, the control electrode is much larger in area than the anode and forms a single ring surrounding the anode. The control electrode is maintained at a voltage level that is negative with respect to the anode, but generally not more negative than the cathode.

This configuration virtually eliminates low-energy tailing when measuring the energy of ionizing radiation. When ionizing radiation is absorbed in the radiation detector, a charge cloud is generated that induces charge initially on all electrodes. The amount of charge induced on each electrode is a function of the distance of the charge cloud from that electrode and the area of the electrode. Because of its small size, the charge on the anode is very small until a charge cloud comes close to the anode. In addition, the control electrode helps shape the electric field to focus the electron clouds toward the anode. As the electron charge cloud drifts towards the anode, the charge induced on the anode remains very small, and the charge on the control electrode builds up until the charge cloud attains a distance from the anode on the order of the size of the anode. The charge on the anode then builds up rapidly to the full value of the charge cloud, while the charge on the control electrode drops rapidly to zero. Hole charge clouds drift toward the cathode and away from the anode, and the effects of hole-trapping in the semiconductor are seen primarily by the control electrode and the cathode. Thus, the signal charge, which is the accumulated charge induced on the anode, essentially equals that of the full electron charge cloud, regardless of its position of origin. Removing dependence on position of the ionizing event from the signal virtually eliminates low-energy tailing. Sharing of induced charge between anode and control electrode, and build-up and decline of induced charge on the respective electrodes, can be understood conceptually in terms of capacitances between a charge cloud and the electrodes and the inter-electrode capacitances.

Another benefit of the small anode is in establishing a field concentration that accelerates charge clouds in the vicinity of the anode. This field concentration is enhanced by the voltage applied to the control electrode. As a charge cloud drifts from its point of origin to the anode, the fraction of charge induced on the anode in any small time increment is a function of the drift velocity. This velocity is increased substantially near the anode by the field concentration, with the result that a large fraction of the total charge is induced on the anode within a small distance from the anode. Thus, the field concentration further reduces the dependence of the signal charge on the position of charge cloud generation.

The field concentration near the anode results in faster rise-time pulses in the external circuitry and also more uniformity of rise-times among pulses. This has the potential benefit of reducing any gain variations in amplification due to pulse rise-time.

In one alternative embodiment, a fourth electrode can be added to separate the charge-shielding and field shaping functions of the control electrode. In another alternative embodiment, more electrodes can be added to further enhance the charge and field shaping functions.

The invention can be used in several cross-strip detector configurations, in a side-entry radiation detector, and with liquid/gas ionization detectors.

The details of the preferred embodiment of the invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings indicate like elements.

DETAILED DESCRIPTION

Throughout this description, the preferred embodiment and examples shown should be considered as exemplars, rather than as limitations on the invention.

(1) 3-Electrode Radiation Detector

Figure 5A:
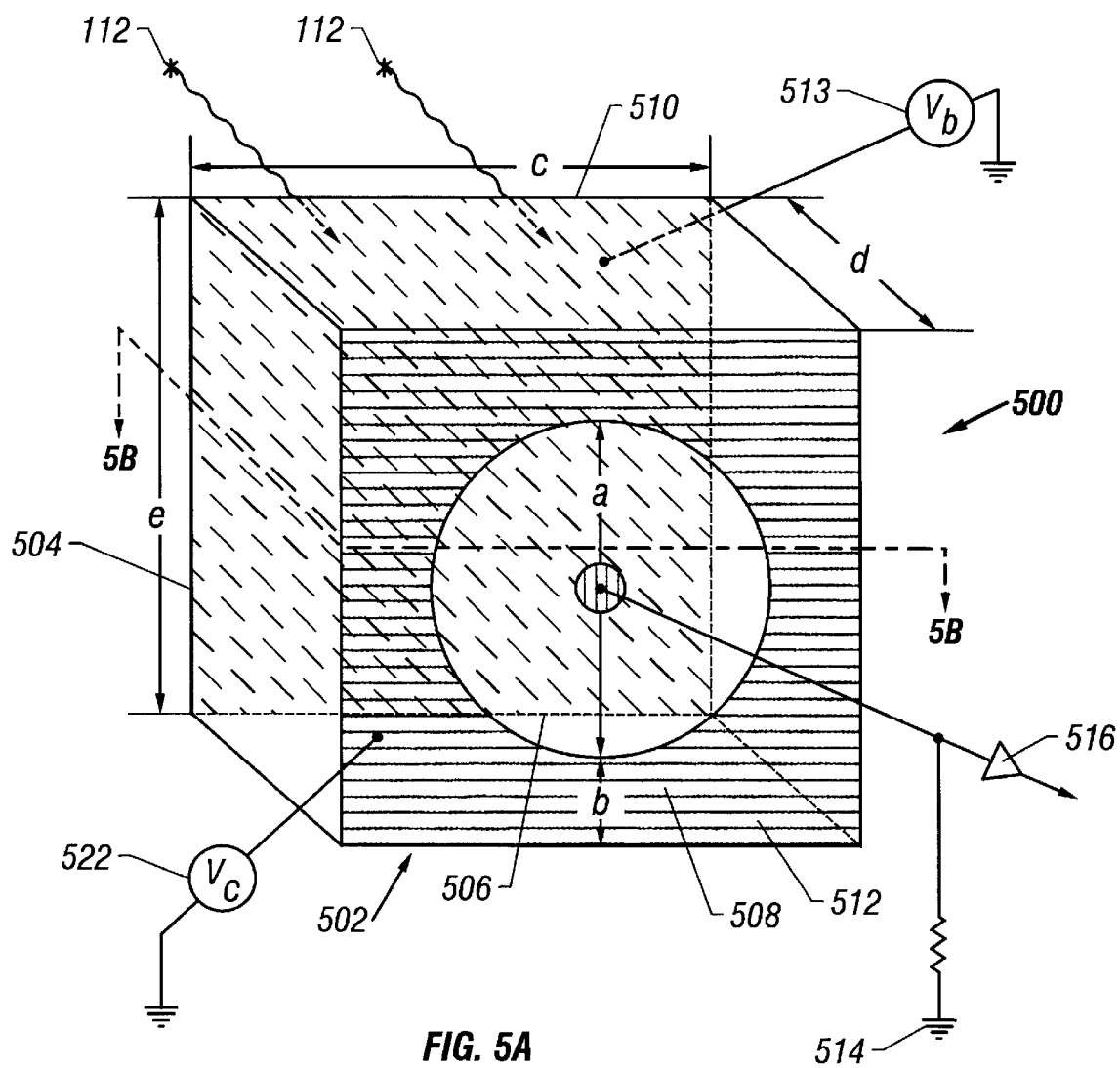
FIG. 5A is a perspective view of the preferred embodiment of a single element configuration of the invention.
Figure 10A:
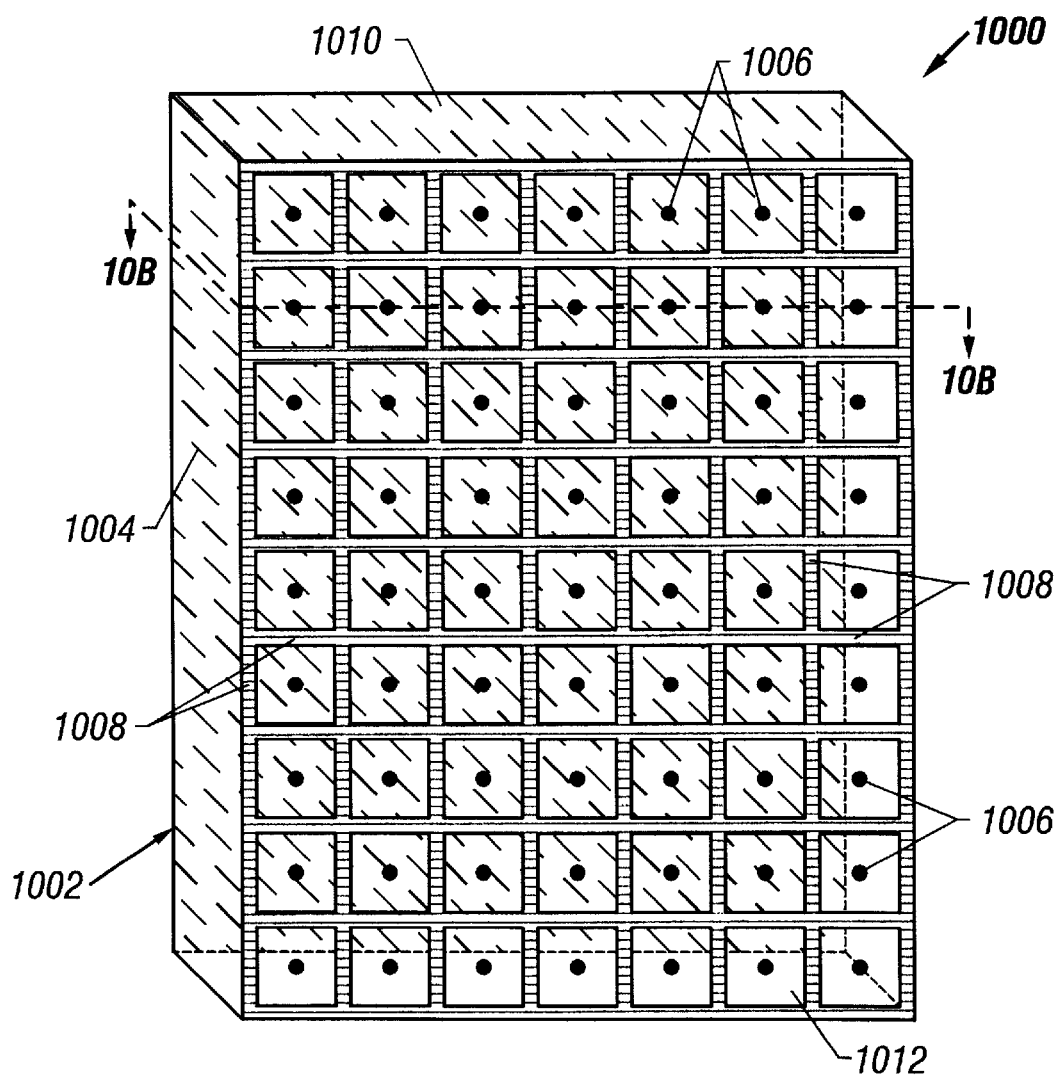
FIG. 10A is a perspective view of an alternative embodiment of the invention showing a detector array structure.

FIG. 5A is a perspective view of the preferred embodiment of a single-element (or single-pixel) radiation detector 500 of the invention. While a single-element detector is shown, it should be understood that the detector of the invention is not limited to the single-element embodiment and can be used in any multi-element configuration. Thus, a number of single-element detectors 500 can be grouped together to form an array of single-element detectors, or, in accordance with the principles of the invention, a monolithic detector array can be fabricated. An example of such a monolithic detector array is shown in FIG. 10A and described below.

The single-element detector 500 of FIG. 5A is preferably capable of detecting energies in the range from a few KeV to over 1 MeV. The detector 500 includes a semiconductor crystal 502, a bias electrode 504, a signal electrode 506, and a control electrode 508. Appropriate biasing of the electrodes creates an electric field within the crystal 502. Ionizing radiation 112 absorbed in the detector 500 causes ionizing events within the crystal 502. The ionizing events, in turn, result in charge clouds that are guided by the electric field toward the signal electrode 506.

For the following discussion, it is assumed that the mobility-lifetime product for electrons is greater than for holes. For the reverse condition, in which the mobility-lifetime product for holes is greater than that for electrons, electric polarity would also be reversed.

(A) The Semiconductor Crystal

The semiconductor crystal 502 is a slab or wafer of high-resistivity, high Z (greater than about 34) semiconductor material. Preferably, the crystal consists of a slab of high-resistivity CdZnTe, which can operate at room temperature and can be fabricated into detectors. Alternatively, the crystal 502 may be formed from CdTe, $HgI_2$, PbI, or other semiconductor materials that have high-resistivity and that can be fabricated into detectors. Of course, those skilled in the art will recognize that virtually any semiconductor material may be used in the invention.

When used in a spectroscopic mode, detectors made from CdZnTe or CdTe yield many lower-energy pulses in addition to the characteristic pulse amplitude for any particular energy of ionizing radiation. That is, such crystals produce significant low-energy tailing. Thus, it is especially important in radiation detectors in which the semiconductor slab is fabricated from CdZnTe or CdTe to design the detector in such a way that minimizes tailing. The invention provides a detector structure that virtually eliminates tailing and thus is particularly well-suited to CdZnTe and CdTe-based semiconductor radiation detectors.

As shown in FIG. 5A, the semiconductor crystal 502 is preferably a rectangular parallelepiped. The crystal 502 may, however, have virtually any desired volumetric shape, including cubic, hemispherical, cylindrical, conic, or rhombic. In one experimental embodiment, the crystal 502 was square on sides 510 and 512, with dimensions "c" and "e" each being about 6.1 mm, and with a thickness "d" of about 3 mm. It should be understood, however, that the dimensions of FIG. 5A are merely exemplary and that the dimensions depend primarily on the application in which the detector is being used and on the measurement conditions. Thus, the crystal 502 may have a smaller or larger surface area on sides 510 and 512. Typically, the surface area of the sides 510, 512 ranges from about one to several hundred square millimeters.

The crystal 502 may have a thickness "d" of greater or less than 3 mm. Preferably, however, the thickness is greater than about 0.5 mm, with the typical range being between approximately 1 mm and 10 mm. (The effect of varying the thickness of the crystal 502 will be described in greater detail below.) Those skilled in the art will recognize that the crystal shape and dimensions may be varied alone or in combination to achieve special performance results or to improve manufacturability.

The novel structure of the invention can be used with virtually any semiconductor or insulating detector material having a resistivity greater than about 10 megohm-cm. If the semiconductor resistivity is less than 10 megohms, the resistivity may be effectively increased to this value by creating a Shottky barrier or p-n junction at one of the electrodes.

(B) The Bias Electrode

The bias electrode 504 is formed as a conductive layer (e.g., by metallizing) on substantially the entirety of the surface of side 510 of the crystal 502. (in the embodiment shown in FIG. 5A, the ratio of the electron mobility-lifetime product to the hole mobility-lifetime product is greater than 1, and the bias electrode 504 thus acts as a cathode and will be referred to as such for the remainder of this description. Of course, if the mobility-lifetime ratio were reversed, the polarity would be reversed, and the cathode 504 would act as an anode.) The cathode 504 may be formed to cover only a portion of a surface of the crystal 502, or to cover more than one surface, and/or several cathodes may be provided on side 510. Further, the cathode 504 may be formed in different shapes and with various dimensions.

The cathode 504 is set to a bias (or cathode) voltage, $V_b$, which is negative with respect to the anode 506, and which depends on the thickness "d" of the crystal 502 and on the application. For the preferred embodiment, in which the crystal 502 is about 3 mm thick, the magnitude of $V_b$ is from about −200 volts to about −1000 volts, and most preferably about −400 volts to about −500 volts. It should be understood, however, that $V_b$ may be any suitable voltage level. The cathode may be set to $V_b$ by coupling the cathode 504 to a constant external voltage source 514, or by any other suitable means for establishing and maintaining a substantially constant voltage level. Preferably, the cathode 504 is coupled to the voltage source 513 via a wire conductor.

(C) The Signal Electrode

In the embodiment of FIG. 5A, the signal electrode 506 is preferably a small conductive contact located at or near the center of side 512, which is the surface of the semiconductor crystal 502 opposing the side 510 on which the cathode 504 is formed in the preferred embodiment. (As explained above, in the embodiment of FIG. 5A, the electron mobility-lifetime product is greater than the same product for holes, and the signal electrode 506 thus acts as an anode and will be referred to as such for the remainder of this description. If the reverse were true, the polarity would be reversed, and the anode would act as a cathode.) The anode 506 of FIG. 5A has a circular shape with a diameter of about 1 mm, the diameter being less than dimension "a." Preferably, the anode 506 is a "dot" contact formed on the surface of side 512. Nevertheless, like the cathode 504, the anode 506 may be formed in a variety of shapes, such as a circle or polygon, and is not fixed dimensionally.

The anode 506 is coupled to external signaling circuitry 516, preferably via a wire connection, and via a resistor to an anode potential, which in the preferred embodiment of FIG. 5A is ground 514. Therefore, the anode 506 is at a more positive voltage level, $V_a$, than the cathode 504, which, as described above, is set to a negative voltage. Consequently, a bias voltage exists across the anode 506 and cathode 504 which creates an electric field within the crystal 502. $V_a$ need not be at ground. Rather, $V_a$ may be any voltage level, provided, however, that $V_a$ and $V_b$ are set to different levels in order to establish a bias voltage between the cathode 504 and anode 506.

(D) The Control Electrode

Figure 6:
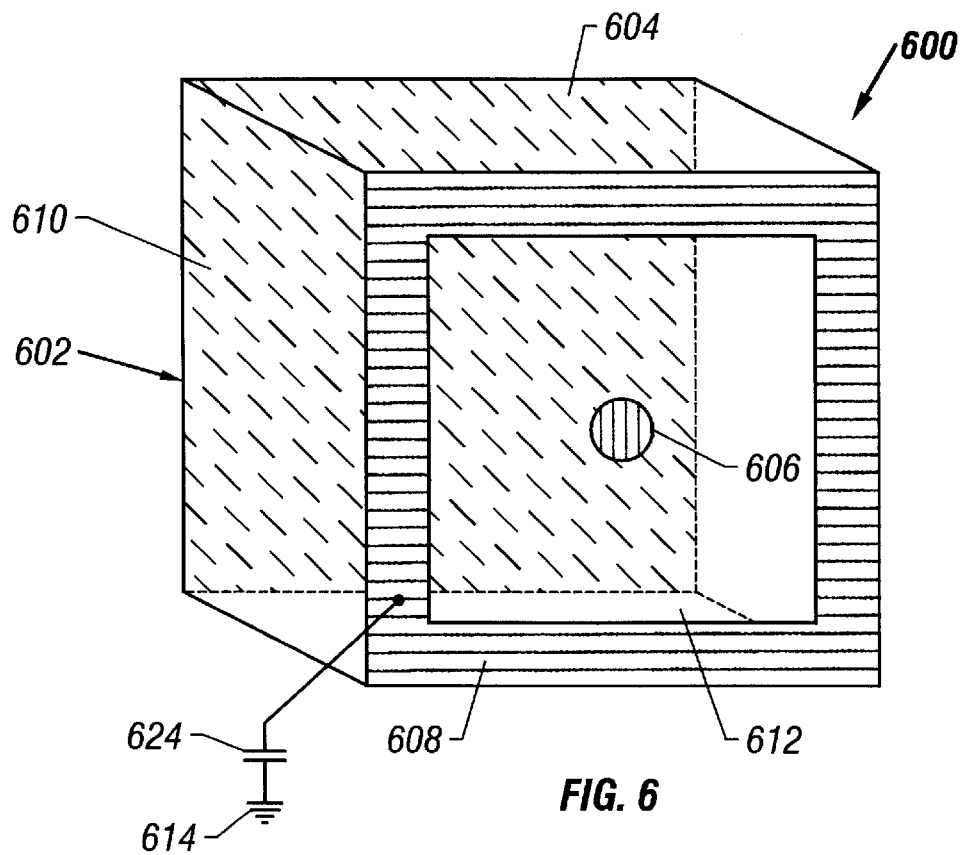
FIG. 6 is a perspective view of an alternative embodiment of the invention.

A third electrode, the control electrode 508, is formed on the same side 512 of the crystal 502 as the anode 506 in the preferred embodiment. As shown in FIG. 5A, the control electrode 508 may be in the form of a conductive circular ring surrounding the anode 506, having an inside diameter, "a", of about 4 mm and an outside dimension, "a"+"2b", of about 6 mm. FIG. 6 shows an alternative embodiment of a radiation detector 600 of the invention, where the control electrode 608 forms a rectangular ring at the perimeter of side 612, with the ring surrounding the anode 606. In radiation detector 600, the control electrode 608 has a width of about 0.5 mm. As defined herein, "ring" means a body or structure having any shape (for example, circular or polygonal) that fully or partially encloses or substantially surrounds another body or structure. Thus, it should be understood that the control electrode 508 is not limited to a circular or rectangular ring around the anode 506, as shown in FIGS. 5A and 6, but may be in the shape of a square, triangle, or other ring shape. Moreover, the control electrode 508 need not fully surround the anode 506. Instead, the control electrode 508 may be an "incomplete" circle or square (rather than a complete ring) or an irregular area formed adjacent to the anode 506. Some alternative control electrode/anode configurations are described in detail below.

The control electrode 508 has a control voltage, $V_c$, which can be a constant voltage level, or may be a controlled or completely variable voltage level. Preferably, $V_c$, like $V_b$, is a negative voltage with respect to the anode. Further, the magnitude of $V_c$ is typically established so that it lies between the magnitudes of $V_b$ and $V_a$. Nevertheless, the magnitude of $V_c$ may be more negative than $V_b$. Accordingly, in the preferred embodiment, the following relationship exists between $V_a$ and $V_c$:

$$V_c < V_a$$

For many applications the maximum detector sensitivity will be at $V_c = V_b$.

$V_c$ may be established in a variety of ways. For example, as shown in FIG. 5A, the control electrode 508 may be coupled to an external voltage source 522 generating a substantially constant voltage. The voltage source 522 is used to maintain the control electrode 508 at $V_c$. When the external voltage source 522 is used to establish $V_c$, current flows into or out of the control electrode 508, depending on whether the potential is greater or less than the potential that would be established by the effective resistances from the control electrode to both the anode and cathode.

Alternatively, as shown in FIG. 6, the control electrode 608 may be coupled to a capacitor 624, which is in turn connected to ground 614. The capacitor 624 can be of any type, including a discrete, monolithic, thick film, or integrated circuit capacitor, or the capacitor 624 can be the parasitic capacitance of the system. The capacitor 624 charges to a voltage determined by $V_b - V_a$ and by the values of the inherent electrical resistances from the cathode 604 to the control electrode 608 and the control electrode 608 to the anode 606. The capacitor 624 prevents $V_c$ from changing significantly as charge is swept past the control electrode 608 during signal-charge collection.

In still another alternative embodiment, $V_c$ (and $V_a$ and $V_b$, for that matter) can be established by applying an AC voltage using, for example, voltage source 522. Similarly, $V_a$, $V_b$, and/or $V_c$ can be established by applying a digital step waveform or other waveform. By applying such variable voltage sources, $V_c$ can be modulated or actively varied to modulate or vary the output count rate of charge signal pulses at the anode 506.

In the illustrated radiation detectors 500 (FIG. 5A) and 600 (FIG. 6), the position and dimensions of the control electrodes 508, 608 are such that, with only a small capacitor (e.g., about 1000 pF) attached to the control electrodes 508, 608, the control electrodes can be maintained at about –250 volts, which is an acceptable operative value of $V_c$ when $V_b$ is about –500 volts. Thus, although the various embodiments of the radiation detector of the invention each require three electrodes, the addition of capacitor 624 to any one of the detector embodiments allows the detector to be operated as a two-terminal device with respect to external circuitry. Alternatively, the control electrodes 508, 608 and cathodes 504, 604 may be connected together, and the detectors 500, 500 can be operated as a two-terminal device with respect to external circuitry, with $V_c$ equal to $V_b$. Moreover, as will be described in more detail below, with the control electrodes 508, 608 held near an optimum $V_c$, nearly all electron charge clouds in the semiconductor crystal 502, 602 are collected by the anodes 506, 606. Thus, nearly all low-energy tailing is eliminated, and the detection efficiency is very high. The control electrodes 508, 608 also minimize effects from defects in the edges of the semiconductor crystal 502, 602.

(E) Electrode Configurations and Features

Figure 7:
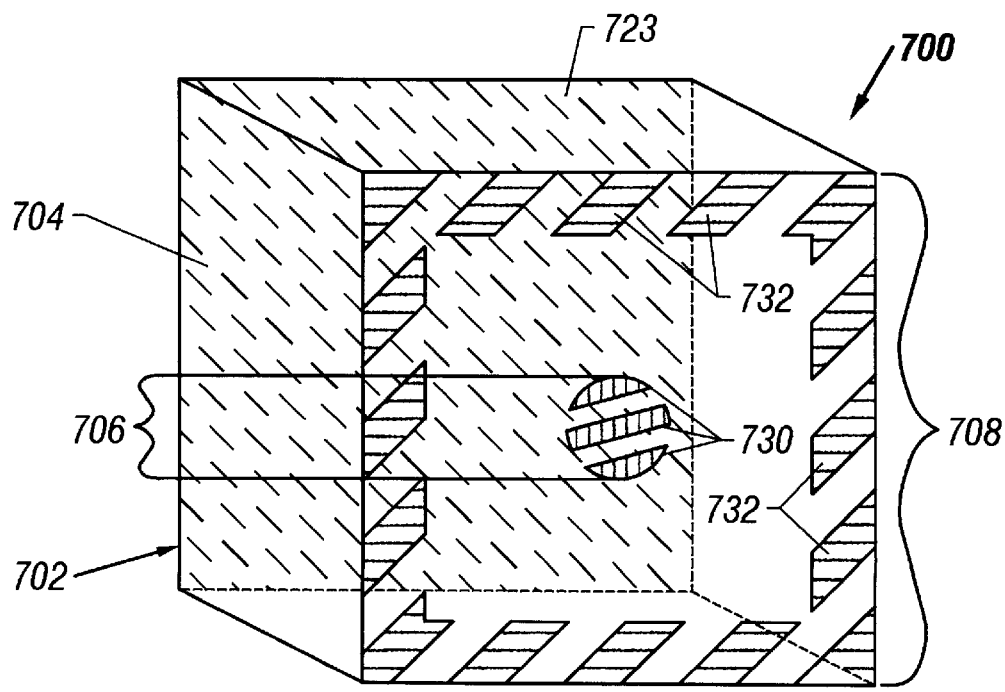
FIG. 7 is a perspective view of another embodiment of the invention showing a segmented control electrode.

FIG. 7 illustrates an alternative embodiment of the invention having a segmented anode 706 and control electrode 708. The anode 706 of FIG. 7 is segmented into a plurality of segments 730, and the control electrode 708 is also segmented into a plurality of segments 732. Both the anode 706 and control electrode 708 may have any number of segments 730, 732, and the segments may take virtually any shape. Moreover, all of the segments 730, 732 of a single anode 706 or control electrode 708 need not have the same shape or the same dimensions. Each segment in a single electrode, therefore, may have its own shape and size.

The different segments 730, 732 may be set at different voltages in order to optimize the electric field distribution within a semiconductor crystal 504. Those skilled in the art will recognize that, through simulation and/or experimentation, such optimizing voltages can be selected empirically.

Figure 8:
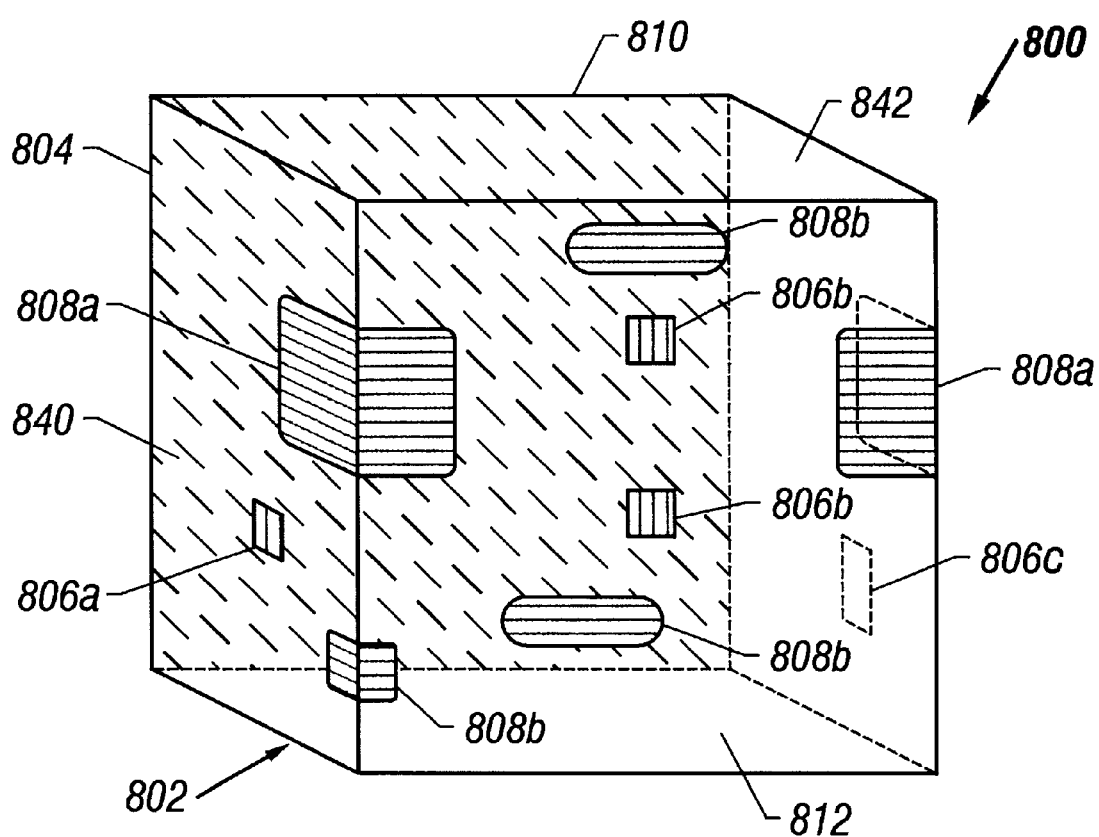
FIG. 8 is a perspective view of yet another embodiment of the invention showing multiple control electrodes and multiple anodes.

Alternatively, as shown in FIG. 8, more than one control electrode 808 and anode 806 may be formed on a semiconductor crystal 504. The various control electrodes 808 can take any shape and size, and may be placed in various positions relative to the anode 806. As with the segments 730, 732, the different control electrodes 808 can be set at different voltages to optimize electric field distribution. In addition, the control electrodes 808 can be formed at various locations on the crystal 504 to optimize the electric field distribution.

As is also shown in FIG. 8, neither the control electrodes 808 nor the anodes 806 need be located on a surface of the detector 800 opposite to that of the cathode 804. For example, in the detector 800 of FIG. 8, the cathode 804 is formed on a first surface 810 of the cubic semiconductor crystal 802. A first control electrode 808a and the anode 806 are both formed on a second surface 840 adjacent to the first surface 810. A second set of control electrodes 808b and anodes 808b are formed on a third surface 812 opposite to the first surface 810. Alternatively, the crystal 802 could have a control electrode 808 on adjacent surface 840 and the anode 806c on another adjacent surface 842. It should be understood from the above that any distribution of the anode and control electrodes on the crystal is possible, so long as the electric field in the crystal is formed to focus the electron charge cloud toward the anode and to shield the anode from the effects of hole trapping.

Further, the cathode, anode, and control electrode need not be restricted to a single surface of the crystal. For example, as shown in FIG. 8, control electrodes 808b extend from one surface of the crystal, around the edges to adjacent surfaces. The electrodes can even extend to more than one adjacent surface. Alternatively, an electrode may be in the form of a band fully or partially encircling the crystal.

Figure 11:
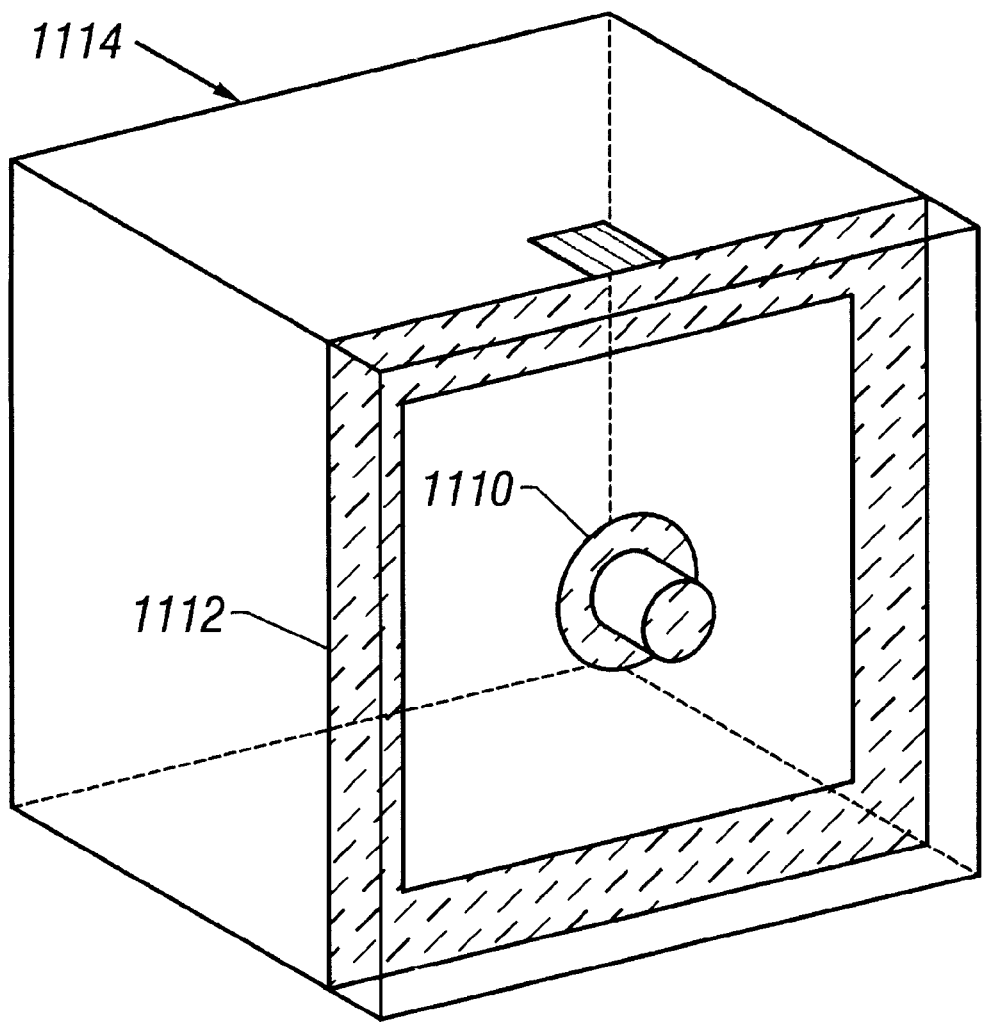
FIG. 11 is a perspective view of a radiation detector having buried electrodes.

The electrodes can be formed on or in the crystal 502 using a variety of techniques. Preferably, the electrodes are gold films, commonly used in CdZnTe detector manufacture, electrochemically deposited on the surface of the crystal 502. Alternatively, other conducting materials, including platinum, rhodium, and other metals, can be electrochemically deposited on the crystal surface 502 to form the electrodes. Those skilled in the art will recognize that nearly any conductor may be used for the electrodes. As an alternative to electrochemical deposition, the electrode material may be deposited on the crystal 502 via evaporation, sputtering, or surface alloying. The electrodes may be formed by other techniques as well, such as ion beam deposition and chemical vapor deposition of conductive materials. The electrodes may be formed in a variety of configurations, including mesa, trenched, and buried configurations. For example, FIG. 11 illustrates a buried anode 1110 and control 1112 electrode in a radiation detector 1114.

For perfect trapped charge shielding in the detector, the ratio of the anode capacitance to the total capacitance from every point inside the detector would be zero. This is approximated at most points because of the relative sizes of the anode and other electrodes and their relative distances. However, near the anode the anode capacitance becomes large because the distance to the anode is smaller than the distance to other electrodes. This effect is minimized by bringing the control electrode very close to the anode. But the difference between the control electrode voltage potential and the anode voltage potential is typically several hundred volts. That voltage potential and the dielectric strength and voltage breakdown characteristics of the materials (including air) between the two electrodes determines how close they can be located to each other. By insulating the control electrode from the crystal and from other materials with a high-dielectric-strength insulator that has good breakdown characteristics and provides a high capacitance value from the control electrode to the crystal, the distance from the anode to the control electrode can be minimized and the detector performance optimized.

Separation between the electrodes can be achieved in a variety of ways. For example, the electrodes can be separated by modifying the surface of the crystal 502, and/or by a bulk material on the surface of the crystal (i.e., by passivation or resistive layers formed by any process).

In order to provide proper electric field shaping, the control electrode should be in ohmic contact with the crystal near the perimeter of the detector. In general, all of the electrodes are preferably ohmic contacts. Nevertheless, the electrodes of the invention need not be ohmic; they could be rectifying, a p-n junction, or some other type of contact.

(F) Theory of Operation of the 3-Electrode Radiation Detector

The operational aspects of the radiation detector of the invention will be described with reference to the preferred embodiment of FIG. 5A. Nevertheless, it should be recognized that the principles described below apply to any embodiment of the invention.

Following is a discussion of what is believed to be the physical basis for the operational characteristics of 3-electrode embodiments of the invention. While sound theoretical considerations indicate that this theory of operation of the invention is correct, it should be understood that the utility of the invention does not rest on the correctness of the following discussion. Further, although the following description refers to radiation detector 500 of FIG. 5A, it should be understood that the principles and theories described are applicable to any configuration of the invention.

The semiconductor crystal 502 has electrons and holes. When an ionizing event occurs within the crystal 502, electrons and holes are formed into electron and hole charge clouds that are transported in a particular manner within the crystal 502. As explained above, the essential electron and hole parameters describing transport properties are (1) mobility, $\mu$, which determines how fast an electron or hole travels in a particular electric field, and (2) trapping lifetime, $\tau$, which is the average time an electron or hole generated by an ionizing radiation remains free and able to participate in the transport process. The mobility-lifetime product ($\mu\tau$) is a critical parameter to consider in analyzing semiconductor radiation detectors, and there is a mobility-lifetime product for electrons, $(\mu\tau)_e$, and a mobility-lifetime product for holes, $(\mu\tau)_h$. The mobility-lifetime product generally differs significantly for electrons and holes in a particular semiconductor. If electrodes are formed on the semiconductor and a voltage potential established between the electrodes, an electric field, E, in the semiconductor will cause the electrons to drift to the anode and the holes to the cathode.

In semiconductors such as CdTe and CdZnTe, the mobility-lifetime product for electrons is generally much larger than that for holes, with the mobility-lifetime ratio, $(\mu\tau)_e/(\mu\tau)_h$, typically being greater than 10. (The principles described below, however, also apply to semiconductor detectors for which $(\mu\tau)_h/(\mu\tau)_e$ is smaller or larger.) The mobility-lifetime ratio may be even higher in other high resistivity semiconductors, such as $HgI_2$ and PbI. For conceptual purposes, assume that the mean-free path ($\mu\tau E$) is large for electrons and small for holes with respect to the detector thickness. Essentially all electrons generated by ionizing radiation reach the anode, and many of the holes are trapped before reaching the cathode. Under these conditions, the amount of charge transported in a planar detector will depend strongly on the position within the crystal at which the ionizing event occurs. If the event occurs very near the cathode, electrons will be swept all the way across the crystal to the anode, holes will be swept to the cathode, and the full charge deposited by the ionizing radiation will be sensed in the external circuit. If the event occurs near the anode, the electrons will be swept to the anode, but holes will be trapped, and the net effect will produce a much reduced output signal. In between, the fraction of deposited charge induced in the external circuit is a function of the distance from the anode at which the event occurs. The dependence of charge response on the position at which the event occurs is the source of unwanted low-energy tailing in planar detectors.

With the three-electrode detector of the invention, at least three factors contribute to the elimination of low-energy tailing.

First, low-energy tailing is reduced by approximately the ratio of the anode area to the control-electrode and cathode areas. When a charge cloud is generated by an ionizing event in the detector 500, charge is induced on all electrodes. The electric field 518 established by the voltages on the electrodes guides the electron cloud to the anode 506 and the hole cloud to the cathode 504. The charge induced on the control electrode 508 is, in general, initially much larger than the charge on the anode 506 because of the relative capacitances between the charge clouds and the anode 506 and the control electrode 508 (approximately the ratio of their areas). This condition is true except when a charge cloud is closer to the anode 506 than to the control electrode 508. As an electron cloud arrives at the anode 506, it accelerates as it gets very near the anode 506 because of the high concentration of electric field 518 at the anode 506, and the charge on the anode 506 builds up very rapidly to the full value of the electron cloud. Conversely, as hole clouds move to the cathode 504, their effect on the anode 506 diminishes. Thus the effects that produce low-energy tailing in planar detectors are reduced from the anode signal by an amount that is approximately the ratio of the anode area to the control-electrode and cathode areas. Thus, the signal charge, which is the total charge collected by the anode 506, is essentially the full charge of the ionizing event, regardless of the position at which the event occurred within the crystal 502. It can be seen that this method of detection removes from the anode charge response its dependence on the position of the ionizing event, which is the source of unwanted low-energy tailing. Furthermore, the negative bias on the control electrode 508 inhibits the collection of electron charge clouds by the control electrode 508, thus maintaining high collection efficiency.

Figure 5B:
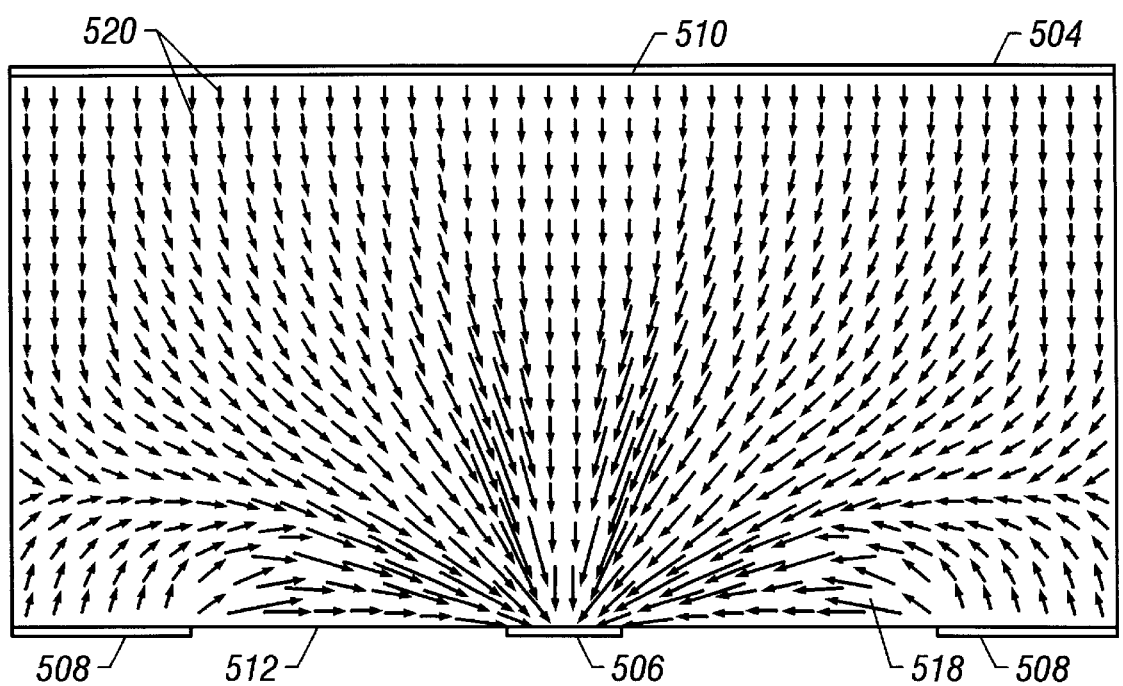
FIG. 5B is a cut-away side view of the embodiment illustrated in FIG. 5A taken along line 5B—5B, showing the electric field created in the semiconductor crystal.

Second, electric field shaping helps reduce low-energy tailing. FIG. 5B is a cut-away side view of the radiation detector 500 of FIG. 5A, showing a calculated electric field 518 that is believed to be created by the preferred three-electrode configuration. As can be seen in FIG. 5B, the electric field 518 is characterized by field paths 520 within the crystal 502 that are uniformly parallel for most of the distance between cathode 504 and anode 506. The field paths become highly concentrated as they closely approach the anode 506. Because the fraction of charge induced on the anode 506 is a function of the velocity of the charge clouds, and because the electric field 518 concentration causes the drift velocity to increase as the clouds approach the anode 506, a large fraction of the total charge is induced on the anode 506 within a short time. Enhancement of field concentration at the anode 506 by the control electrode 508 results in a charge signal at the anode 506 that has a faster rise time and minimizes the variance in rise times that are normally encountered in semiconductors such as CdTe and CdZnTe. This in turn results in more uniform amplification by external circuits 516 that have finite clipping times.

Third, the control electrode 508 also removes some of the charge clouds that have poor transport properties as a result of being generated near the perimeter of the crystal 502 where structural defects may be more frequently encountered. Such charge clouds cause low-energy tailing. Nevertheless, by adjusting the voltage of the control electrode 508, such charge clouds can be collected by the control electrode 508 instead of the anode 506, thereby preventing such charge clouds from causing low-energy tailing.

(G) Example of Operation

Figure 9:
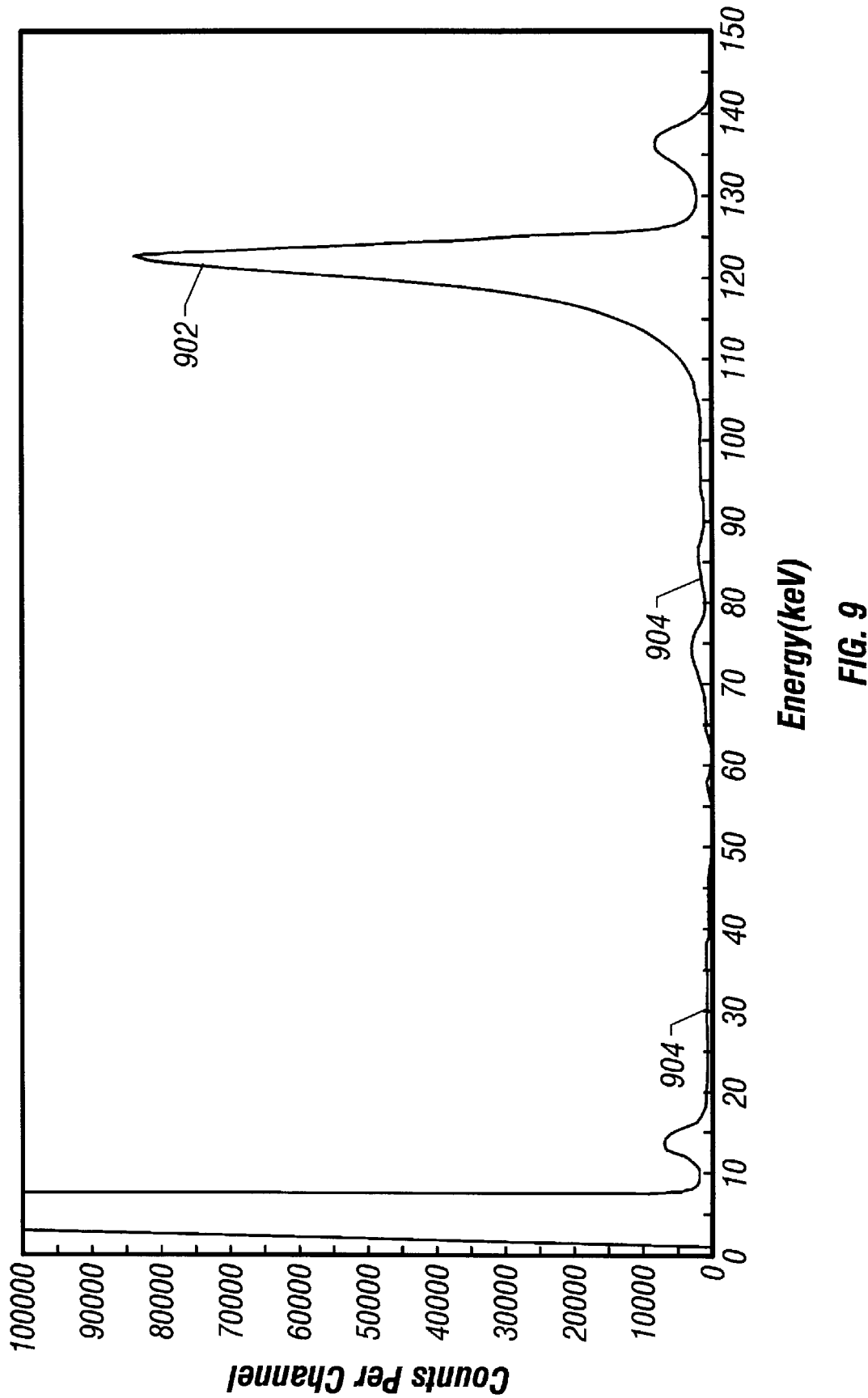
FIG. 9 is an energy pulse histogram for the preferred embodiment of the invention illustrated in FIG. 5A, employing a CdZnTe semiconductor.

FIG. 9 shows a signal pulse histogram of the gamma radiation from Tc-99 mm for an actual radiation detector configured in accordance with the 3-electrode detector 500 of FIG. 5A. The actual detector employed a rectangular parallelepiped CdZnTe semiconductor crystal. The dimensions of the crystal were about 6.1 mm by 6.1 mm on the sides, with a thickness of about 3 mm. The detector had a cathode covering one surface of the crystal and an anode and control electrode on the opposite surface, with $V_a$=0 volts, $V_b$=−450 volts, and $V_c$=−250 volts.

Figure 1:
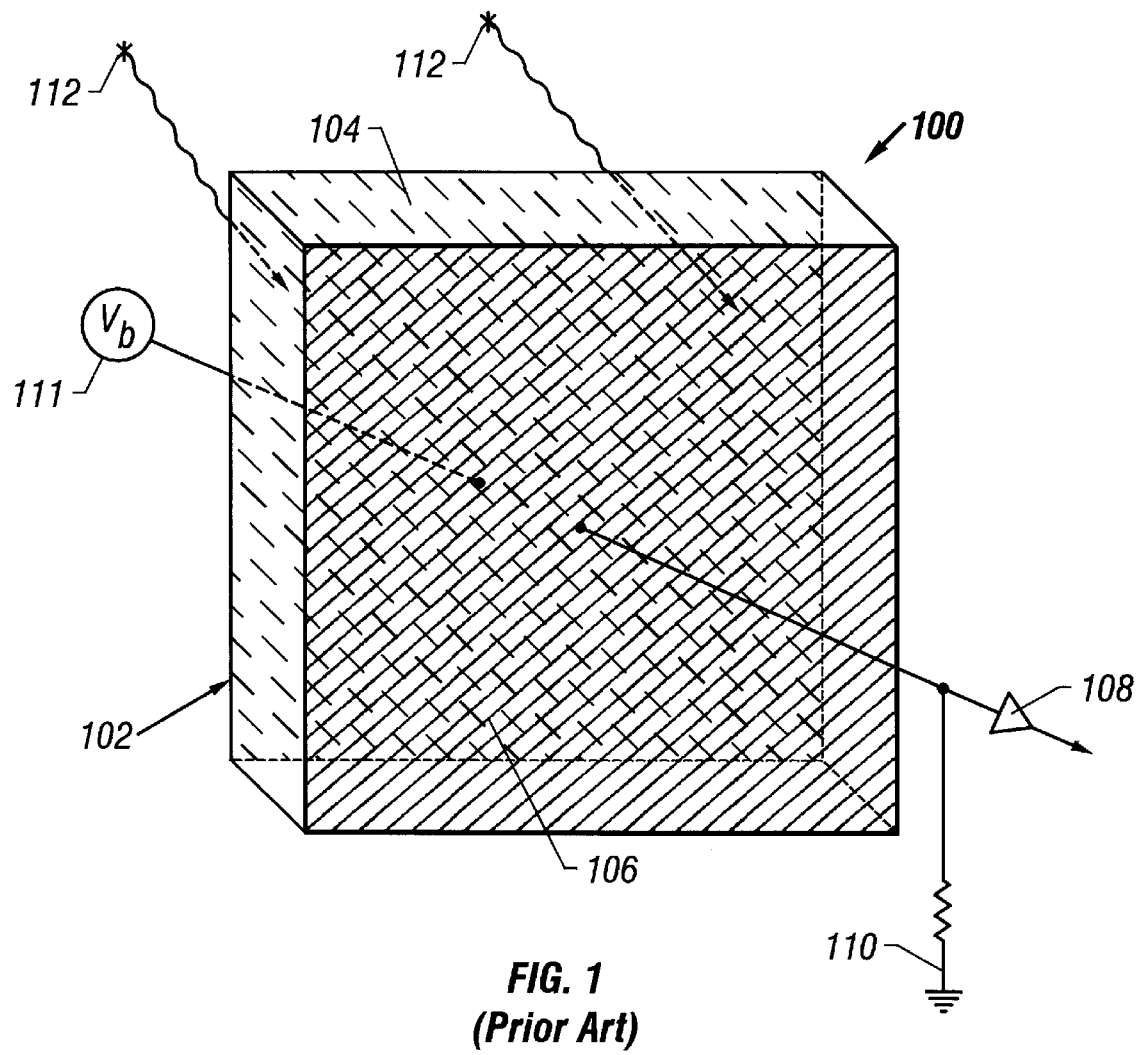
FIG. 1 is a perspective view of a prior art planar radiation detector.
Figure 2:
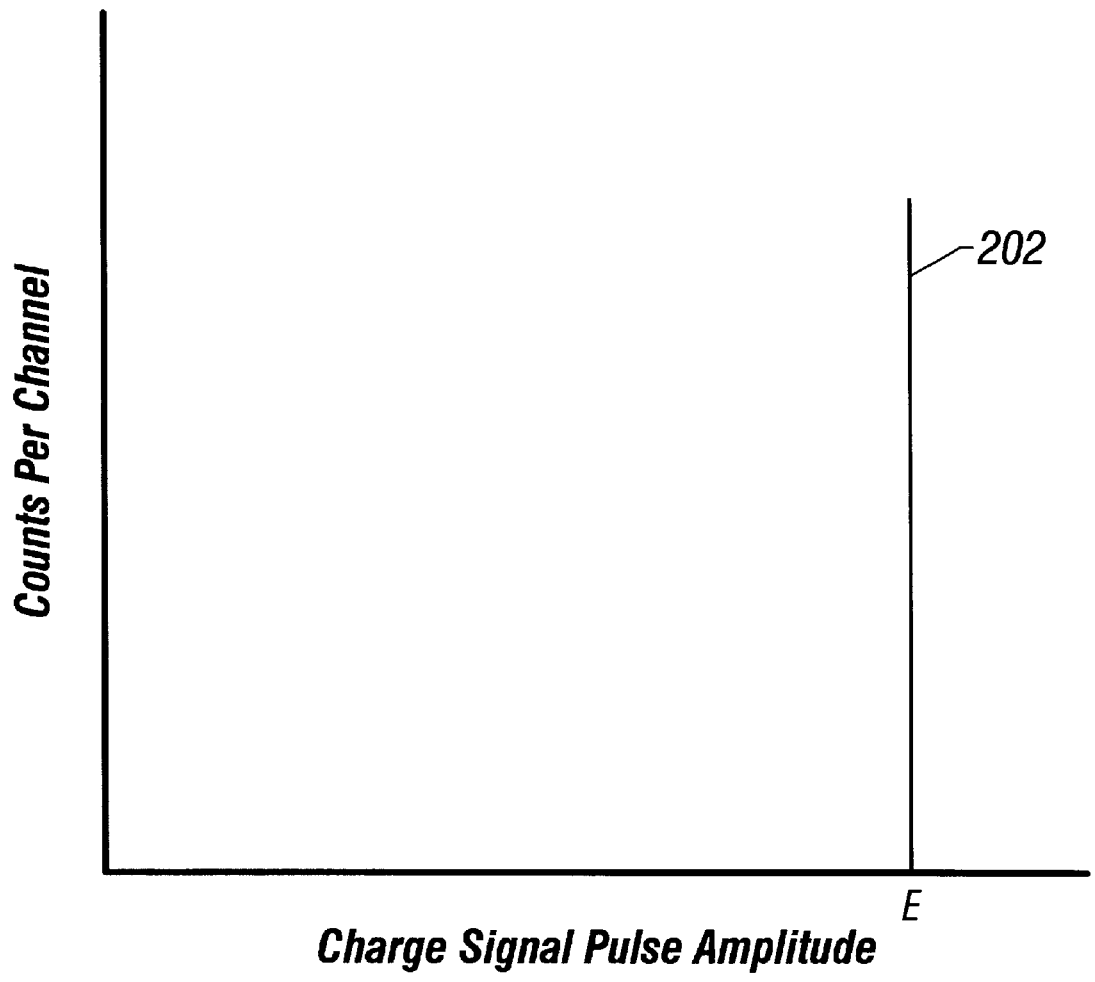
FIG. 2 is an energy pulse histogram for an ideal radiation detector in which counts per channel are plotted versus charge signal pulse amplitude.
Figure 3:
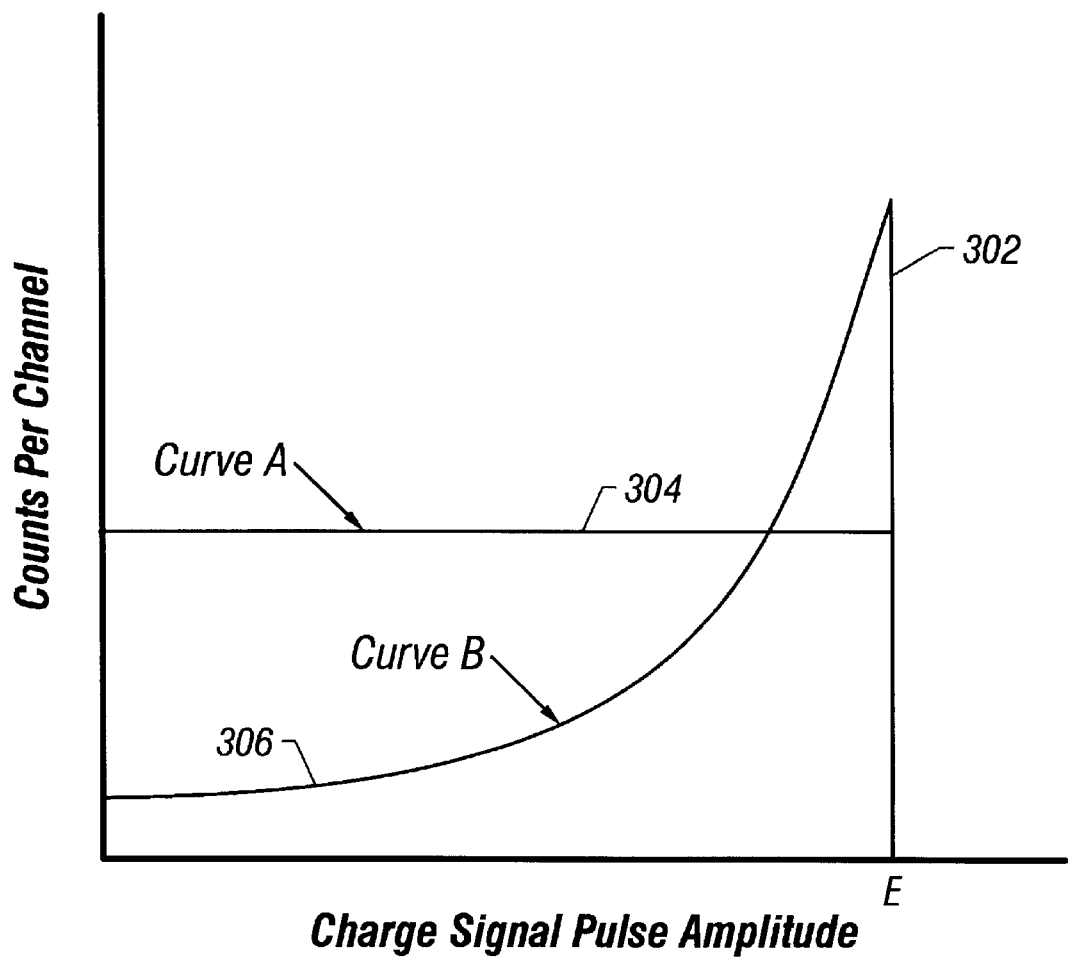
FIG. 3 is an idealized energy pulse histogram for two different radiation detectors, in which Curve A represents the histogram that results if the ionizing radiation are absorbed uniformly throughout the semiconductor crystal, and Curve B represents the histogram that results if absorption is large near the cathode and drops off exponentially as the ionizing event moves in a direction away from the cathode.
Figure 4:
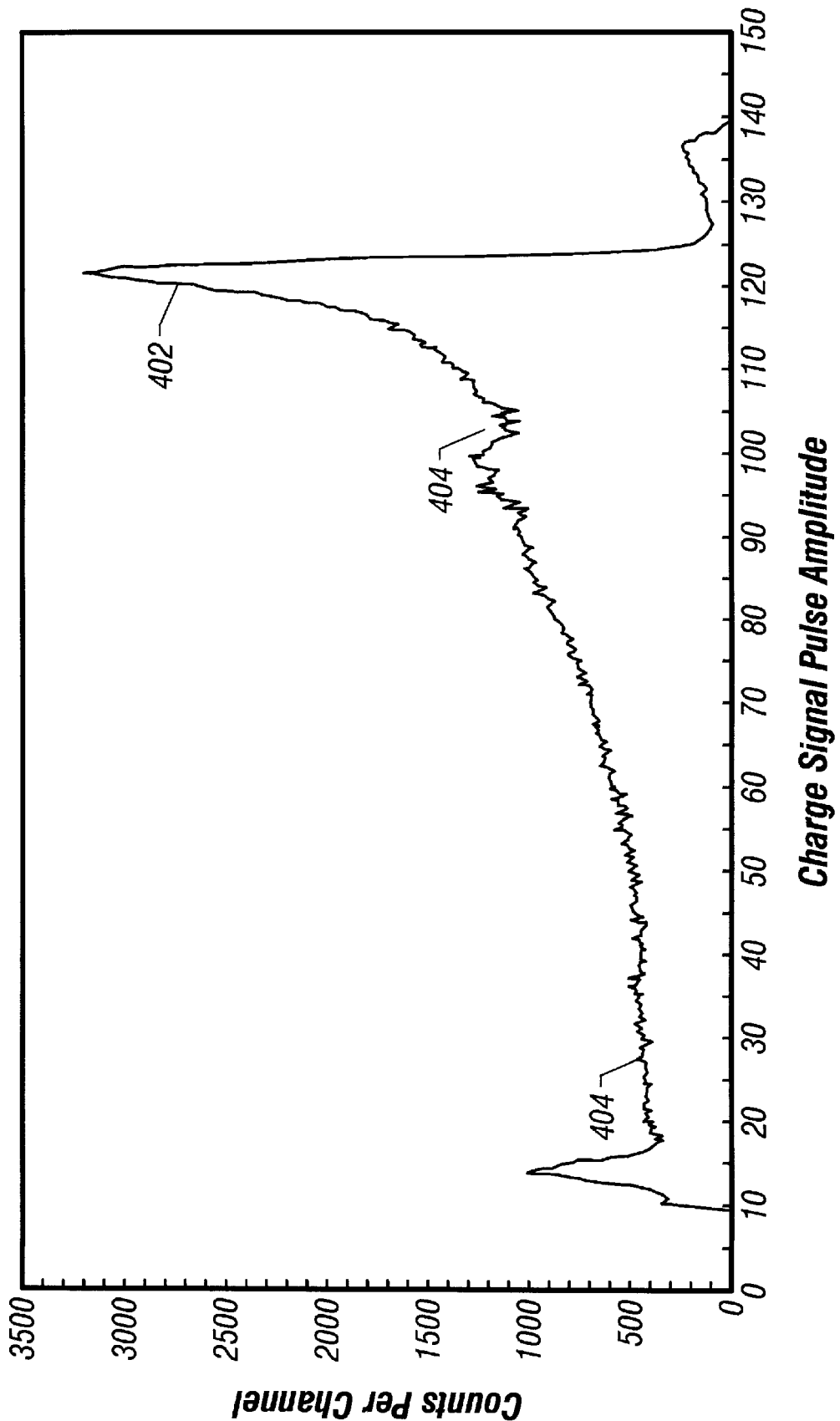
FIG. 4 is an energy pulse histogram for an actual prior art CdZnTe planar detector, illustrating low-energy tailing.

FIG. 9 clearly demonstrates the virtual elimination of low-energy tailing that can be achieved with the invention. A large photopeak 902 exists at the energy level of the ionizing radiation, and only a small amount of low-energy pulses were detected, indicated by tall 904. The reduction in tailing achieved with the detector of the invention is evident in comparing the histogram FIG. 9 with that of FIG. 4. The histogram of FIG. 4 was acquired with a conventional CdZnTe planar detector with the same crystal dimensions and quality as that of FIG. 9. As can be seen, FIG. 4 has a broadened photopeak 402 at the target energy, indicating a degradation of resolution, and a substantial amount of low-energy tailing 404, indicating a reduction in peak efficiency. It is interesting to note the relative amplitudes of the three energy peaks. The total counts in the peaks should be proportional to the emission probabilities for those peaks. For cobalt-57, those probabilities are: 1) 14.413 KeV-9.14%, 2) 122.06 KeV-85.68%, and 3) 136.45 KeV-10.67%. In FIG. 9, the relative magnitudes of counts in the peak are very close to those emission probabilities, while, in FIG. 4, it appears that at least half of the counts that should be in the peaks are in the low-energy tails of the higher energy peaks. (The two curves of FIGS. 4 and 9 were obtained with detectors of identical dimensions and identical surrounding materials; therefore, the two curves can be compared for relative peak amplitudes, although direct comparison of peak amplitudes cannot be made without photon absorption data for each peak.)

Accordingly, as evidenced by the histogram of FIG. 9, the addition of the control electrode 508 and its affect on the shape of the electric field 518 results in virtual elimination of low-energy tailing. The detector of the invention therefore achieves high-resolution and collection efficiency, despite the charge transport problems inherent in high-resistivity, large-mobility-lifetime-ratio semiconductor materials. Furthermore, the invention is simple and inexpensive to manufacture.

(H) Additional Aspects and Features of Operation

The magnitude of $V_c$ can be established by experiment. If the magnitude of $V_c$ is too small, the anode 506 will collect only some of the electron clouds, and the collection efficiency of the radiation detector 500 will be low. The optimum value for $V_c$ is dependent on electrode geometry. In the radiation detector 500 of FIG. 5A, the preferred value of $V_c$ is in the range from $(V_a+V_b)/2$ to $V_b$. The value of $V_b-V_a$ is chosen based on the thickness of the semiconductor crystal and the requirement of the application. For a 3 mm thick crystal, $V_b-V_a$ may be about −400 volts.

The resistances between the cathode 504 and control electrode 508 and between the control electrode 508 and anode 506 can be tailored to achieve specific performance results. This is done by varying the electrode geometry and by changing bulk or surface resistivity by ion damage, ion implantation, thermo-chemical treatment, and/or other means.

The radiation detector of the invention can be used with nearly any crystal thickness. Preferably, however, the thickness is at least about 0.5 mm. The only limitation on the thickness is that the larger air product (i.e., $(\mu\tau)_e$ or $(\mu\tau)_h$) must be sufficiently large for most of the charge carriers to traverse the thickness of the crystal. For state-of-the-art CdZnTe, this thickness is approximately 10 mm. For a single anode on a crystal, the useful area of the detector may be limited by the maximum anode capacitance that can be accommodated by the electronics and by the ability to form an electric field that will guide the electron clouds to the anode. Large areas may be achieved by appropriate geometries for the anode and the control electrode. Larger areas may also be used by forming grid structures similar to the detector array configuration described below, but with the anodes connected together.

Thus, the thickness of the semiconductor crystal of the invention can be substantial and, thereby, can provide high sensitivity and high detection efficiency for a wide range of radiation energies.

If an embodiment of the new device is maintained in a constant flux of ionizing radiation, varying the voltage ($V_c$) of the control electrode 508 below its optimum value will cause the count rate to vary in a corresponding manner. Thus, the radiation detector of the invention can be used to modulate the signal from a beam of ionizing radiation.

(2) 4-Electrode Radiation Detector

An alternative embodiment provides an improved structure for achieving enhanced charge collection in the photopeak of a solid-state radiation detector that exhibits charge carrier trapping, particularly holes. This embodiment is particularly advantageous with large volume radiation detectors used for achieving high-efficiency detection and for high-energy gamma-rays. As the volume of a radiation detector increases, it is more difficult to simultaneously achieve good energy resolution, good detection efficiency, and good peak-to-valley efficiency in the spectrum. The purpose of this embodiment of the invention is to minimize the compromise among these parameters.

The 3-electrode radiation detector described above uses a control electrode positioned around the anode to focus the charge from the total detector volume to the anode and to shield from the anode the effects of induced positive charge of trapped holes. However, the ideal electrical potential of the control electrode for focusing electron charge to the anode may be approximately the potential of the cathode, while optimum shielding is achieved when the control electrode covers the entire surface not covered by the anode. In the latter case, there must be sufficient distance between the anode and the control electrode to avoid voltage breakdown at the anode. These requirements seem to be mutually exclusive, each requiring some compromise for achieving overall acceptable performance.

Figure 12A:
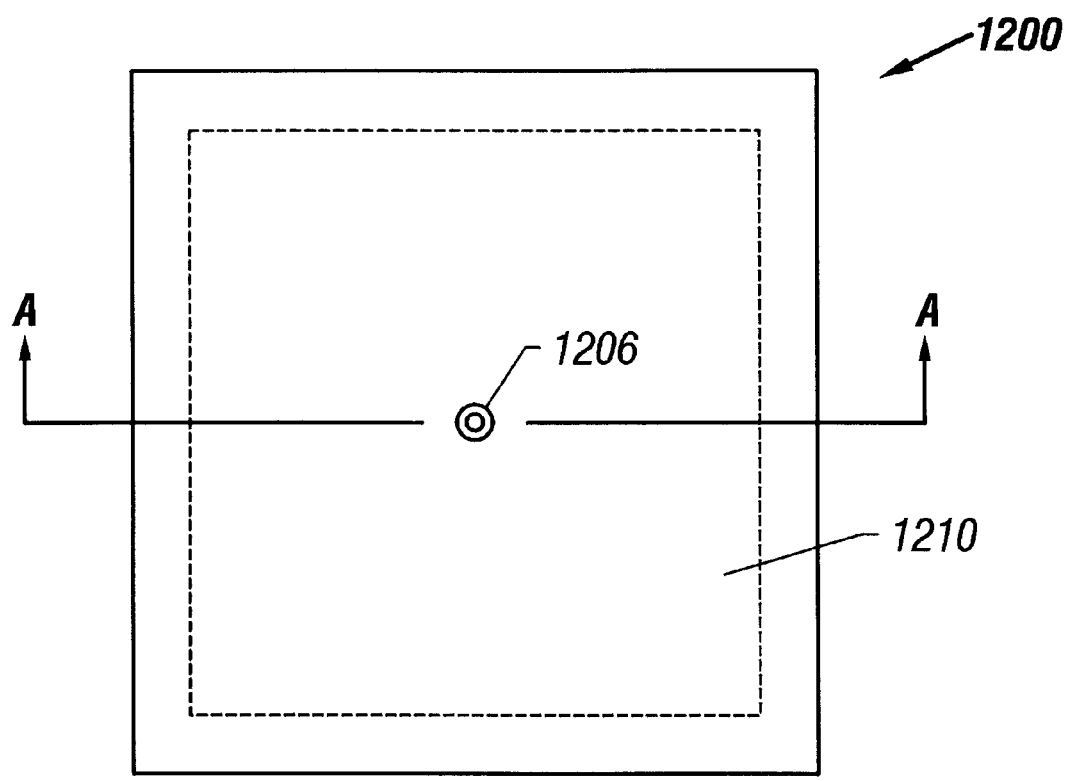
FIG. 12A is a top view of the preferred embodiment of a 4-electrode configuration of the invention.
Figure 12B:
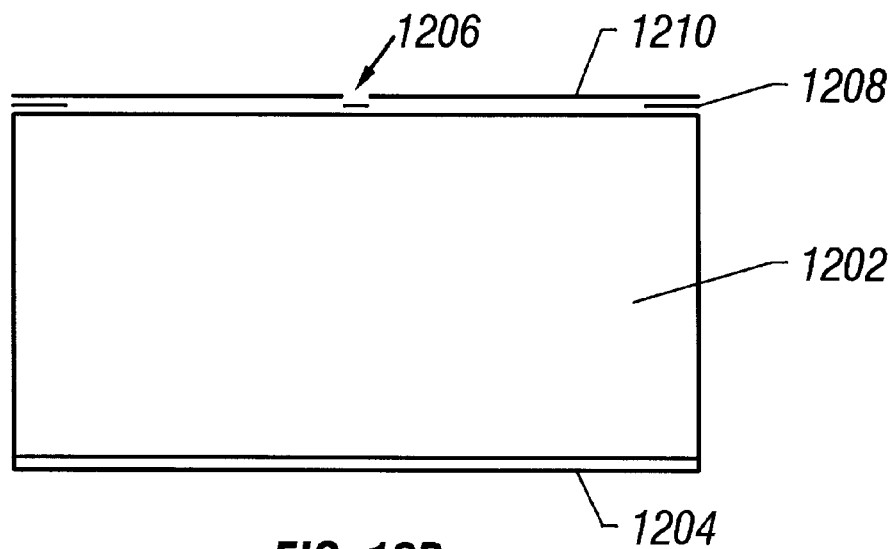
FIG. 12B is a side cross-sectional view the 4-electrode configuration of FIG. 12A, taken along line A—A of FIG. 12A.

An alternative embodiment of the invention separates the charge focusing function and anode shielding functions of the control electrode by having a shield electrode separate from a focus control electrode—in essence adding a fourth electrode to the three-electrode configuration described above. FIG. 12A is a top view of the preferred embodiment of a 4-electrode configuration of the invention. FIG. 12B is a side cross-sectional view the 4-electrode configuration of FIG. 12A, taken along line A—A of FIG. 12A. In this embodiment, the radiation detector 1200 includes a semiconductor crystal 1202, a bias electrode (e.g., a cathode) 1204, a signal electrode (e.g., an anode) 1206, a focus control electrode 1208, and a shield electrode 1210 shown insulated from and overlying the focus control electrode 1208.

In a typical configuration, the bias electrode 1204 is a cathode that provides the negative electrical potential for biasing the radiation detector 1200, the signal electrode 1206 is an anode that collects the signal charge, the focus control electrode 1208 focuses the electron charge to the anode, and the shield electrode 1210 minimizes charge at the anode induced by trapped charges within the radiation detector 1200. In most applications where this embodiment is applicable, the charge transport properties are better for electrons than for holes. In any application where the reverse is true, the same structure can be applied with the bias voltage reversed. Thus, the signal electrode 1206 would become the cathode and the bias electrode 1204 would become the anode. The other electrodes would be the same as described with appropriate bias voltages applied.

The focus control electrode 1208 can be strategically placed on the surface of the radiation detector 1200 for best shaping of the electrical field without the need for high capacitance, and thus can maintain adequate distance from the anode to avoid injection of pulse-breakdown noise into the anode signal. In the illustrated embodiment, the focus control electrode 1206 is formed as a narrow band around the perimeter of the signal electrode 1206 side of the radiation detector 1200.

The shield electrode 1210 preferably covers most of the anode-side of the radiation detector 1200, except for an area large enough for the anode. The shield electrode 1210 can be held at any convenient electrical potential. In the preferred embodiment, the shield electrode 1210 is directly or capacitively connected to ground (perhaps via the cathode) in order to provide good shielding characteristics, and is isolated from the anode to prevent charge injection into the signal.

The shield electrode 1210 should have a high capacitance with respect to points within the radiation detector 1200. Thus, in the preferred embodiment, the shield electrode 1210 is insulated from the surface of the radiation detector 1200 by a material that has a high dielectric constant for maximum capacitance to points within the detector, and high dielectric strength to avoid voltage breakdown. One such material is epoxy-based solder mask.

In this embodiment, performance of the radiation detector 1200 relies primarily on the focus control electrode 1208 for achieving maximum detection efficiency and on the shield electrode 1210 for eliminating the effects of charge trapping (typically hole trapping). By assigning the charge-shielding function to the shield electrode 1210 and making the function of the focus control electrode 1208 principally that of shaping electrical field within the radiation detector 1200, both functions can be performed better. Use of a shield electrode 1210 may also be applicable to any device where it is beneficial to shield an electrode from the effects of induced charge from trapped charge carriers.

(3) 5-Electrode Radiation Detector

Figure 12C:
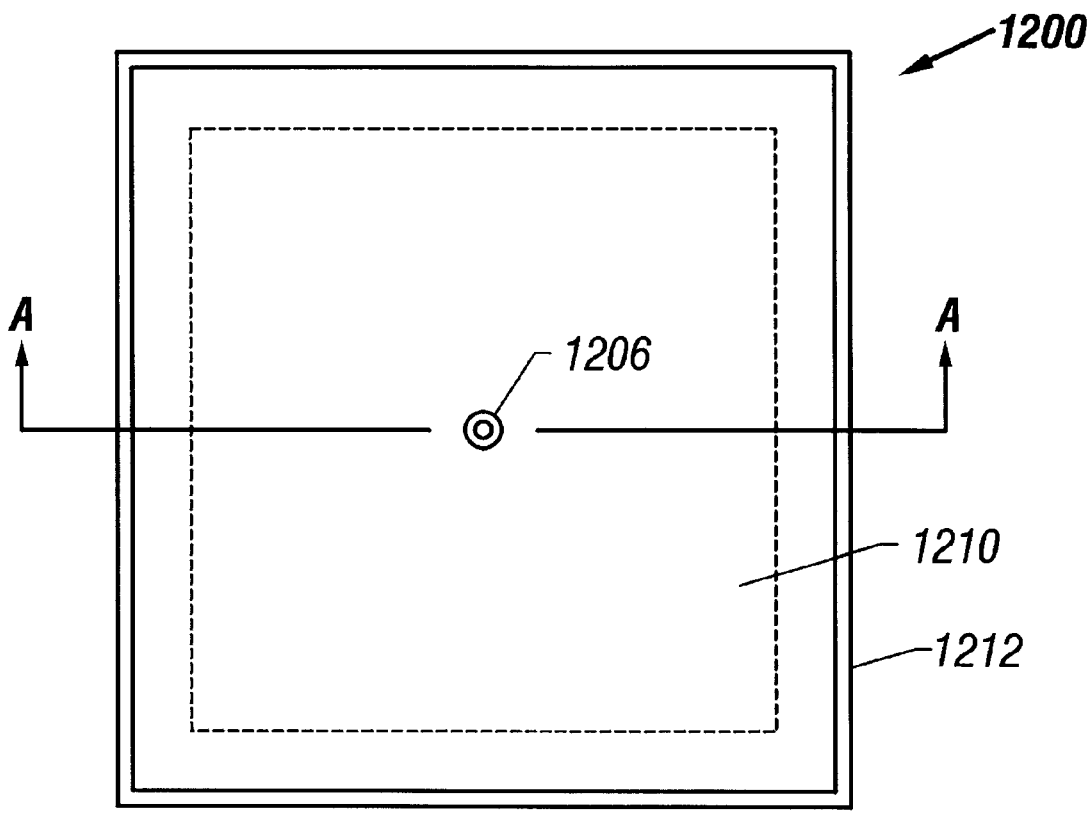
FIG. 12C is a top view of the preferred embodiment of a 5-electrode configuration of the invention.
Figure 12D:
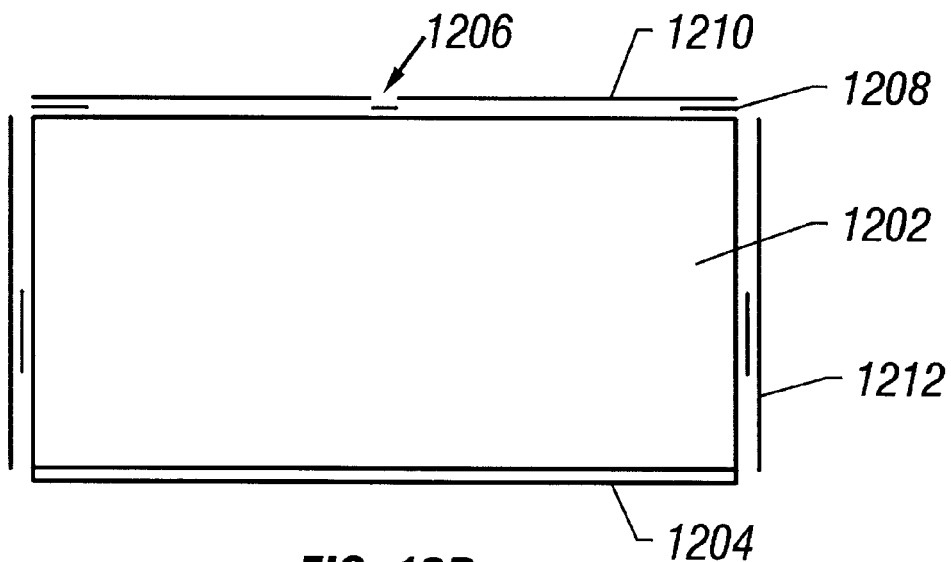
FIG. 12D is a side cross-sectional view of the 5-electrode configuration of FIG. 12C, taken along line A—A of FIG. 12C.

Another embodiment of the invention adds a supplement shielding fifth electrode 1212 to the radiation detector 1200 shown in FIG. 12B. FIG. 12C is a top view of the preferred embodiment of a 5-electrode configuration of the invention. FIG. 12D is a side cross-sectional view the 5-electrode configuration of FIG. 12C, taken along line A—A of FIG. 12C. A typical configuration of such a radiation detector 1200 is a parallelopiped or a right circular cylinder with a fifth electrode 1212 covering most or all of the side surfaces orthogonal to the anode and cathode surfaces. The fifth electrode 1212 may be plated on the side surfaces or insulated from those surfaces. If the fifth electrode 1212 is ohmically connected to the side surfaces, a bias voltage is applied that helps in shaping the electric field in the radiation detector 1200 for optimum charge collection at the anode. If the fifth electrode 1212 is not ohmically connected to the detector, it must be connected, at least capacitively, to reference ground (which could be through some power supply or by direct connection). The fifth electrode 1212 may be patterned into different shapes if desired.

The fifth electrode 1212 increases the capacitance in the denominator of the capacitance ratio that determines charge induced on the anode. In other words, the fifth electrode 1212 serves to increase the shielding of induced charge from the anode, and thus shape the electric field in the detector. The function of shaping electric field may be important in some geometries.

In similar fashion, additional electrodes can be added, each with its own voltage for shaping electric field and, thereby, optimizing charge collection, in addition to providing additional charge shielding.

(4) Timing Correction for Electron Trapping

When a gamma ray is absorbed in a radiation detector made in accordance with the invention, electrons and holes are formed at the site of the event and, as they drift toward the collecting electrode(s), a signal is induced on the electrode(s). With the electrode configurations described above (see, for example, FIGS. 5A and 12A), the signal generally is initially induced on the cathode and on the control electrode but does not show up on the anode until the electrons have drifted close to the anode.

By measuring the signals on the cathode, control electrode, and anode, a timing relationship can be determined for the occurrence of the initiating event and for the arrival of the drifting electrons at the anode. For example, the time from when the cathode signal exceeds a selected threshold, $T_c$, to the time when the anode signal exceeds a selected threshold, $T_a$, can be measured using any of many conventional means. As another example, the time from when the signal on the control electrode exceeds a selected threshold, $T_{ct}$, to the time when the anode signal exceeds a selected threshold, $T_a$, can be measured using any of many conventional means. Such timing information is important for a number of reasons.

(1) Knowing the time of absorption is important for positron emission tomography (PET) for determining coincidence with a similar event in another detector. Coincident timing on the order of 10 nanoseconds may be required for many PET applications.

(2) Knowing the drift time of the electrons can allow signal compensation for the effects of electron trapping in large detectors. In prior art detectors, the effects of hole trapping predominate and the effects of electron trapping are small. The effects of hole trapping are so severe that no meaningful improvement can be achieved by compensation for electron trapping. However, in a radiation detector made in accordance with the invention in which the effects of hole trapping have been nearly eliminated, electron trapping becomes a more prominent factor. Also, electron trapping may be somewhat greater in such radiation detectors because the electric field is non-uniform and is intensified near the small anode and correspondingly decreased away from the anode. Where the electric field is low, the transit time should be longer, with a corresponding increase in charge trapping. In a planar detector, the electric field is expected to be uniform. In a 3 mm cubic planar radiation detector, typical electron trapping varies from 0% to about 3% depending on the location of gamma-ray absorption and the corresponding drift-path length. As the detector size gets larger and path lengths get longer or electron mean-free-path lengths get shorter, energy resolution is more affected by electron trapping.

By determining the drift time of electrons in the detector, an improvement in energy resolution can be realized by correcting for electron trapping. This can be done by measuring the electron drift time and adding to the signal a small amount of charge that is a function of the drift time. The amount of charge added for the maximum drift time would be set equal to the maximum electron-charge loss corresponding to that maximum drift time. Though the charge loss is a negative exponential function of the drift time, for systems in which the maximum charge loss is a few percent, the charge loss can be closely approximated with linear proportionality. The equation for electron charge trapping is:

$$q_{e(trapped)} = q_o\left(1 - e^{-\frac{t}{\tau_e}}\right) = q_o\left[1 - \left(1 - \frac{t}{\tau_e} + \frac{t^2}{2\tau_e^2} - \frac{t^3}{6\tau_e^3} + \ldots\right)\right]$$

$$q_{o(trapped)} \approx \frac{t}{\tau_e} \quad \text{for } t \text{ much smaller than } \tau_e.$$

The system would be calibrated using conventional techniques to obtain the best energy resolution. Adding lost charge to delayed events will narrow the energy peak; however, adding more charge than was lost will again widen the energy peak.

Another method for compensating for electron charge loss is by measuring the charge induced on the cathode and control electrode(s) by trapped hole charge and trapped electron charge, and using the measured magnitudes to determine the amount of compensation to provide.

(3) The depth of interaction of an ionizing event in the semiconductor crystal can be determined from timing information. For example, for the embodiment shown in FIGS. 10A and 10B, an ionizing event occurring closer to the cathode than the anode will cause the time from when the cathode signal exceeds a selected threshold, $T_c$, to the time when the anode signal exceeds a selected threshold, $T_a$, to be different than if the ionizing event occurs closer to the anode than the cathode. Calibration using conventional techniques can map the timing information to depth of interaction.

Depth of interaction is very important in any imaging application where the angle of incidence of a photon with the detection plane of the imager is other than normal to the surface and the detector thickness is comparable to or greater than the detection element size. In such cases, the photon may be absorbed deep in the detector in a detection element other than the element where the photon entered the imager surface. Applications where measurement of depth of interaction is important include coded-mask imagers and positron-emission tomography.

Another method of determining depth of interaction involves measuring the magnitude of signals on the cathode, control electrode, and/or shield electrodes. It is known that the amplitude of a detected gamma-ray-absorption event in a prior art room-temperature, semiconductor detector is dependent on the depth of interaction in the detector, i.e., the correct magnitude is decreased by a factor that is a function of the depth at which holes are trapped, which in turn is a function of the location at which the initiating photon is absorbed. In the present invention, the full amplitude signal is obtained at the anode because the anode is shielded from the effects of trapped charge by the other electrodes, while the signals on the other electrodes are each a function of the position of the trapped charge. For any given detector geometry and material, a relationship between the relative magnitude of an electrode signal and the depth of photon absorption can be established by analysis or by testing. In a planar detector, the charge induced on the cathode by trapped charge is a linear function of the distance of the trapped charge between the anode and cathode, and the mean location of the trapped charge is a fixed distance from the depth of photon absorption, i.e., it is established by the mean-free path ($\mu\tau E$). In the present invention, if the electrodes on the anode side of the detector cover essentially the entire anode side of the detector, the relationship between the magnitude of the cathode signal and depth of photon interaction is essentially identical to that of a planar detector. The depth of interaction can be determined by dividing the cathode signal by the anode signal and multiplying the product by the appropriate function. Likewise, a relationship can be determined between depth of interaction and the magnitudes of each of the other electrodes.

Determination of depth of interaction in some detector designs may require combining signals from more than one electrode in order to take into account geometric considerations. For some applications, although the use of all signals might be required for best accuracy, sufficient accuracy may be achieved with the signal from only a single electrode.

(5) Detector Array Embodiment

Figure 10B:
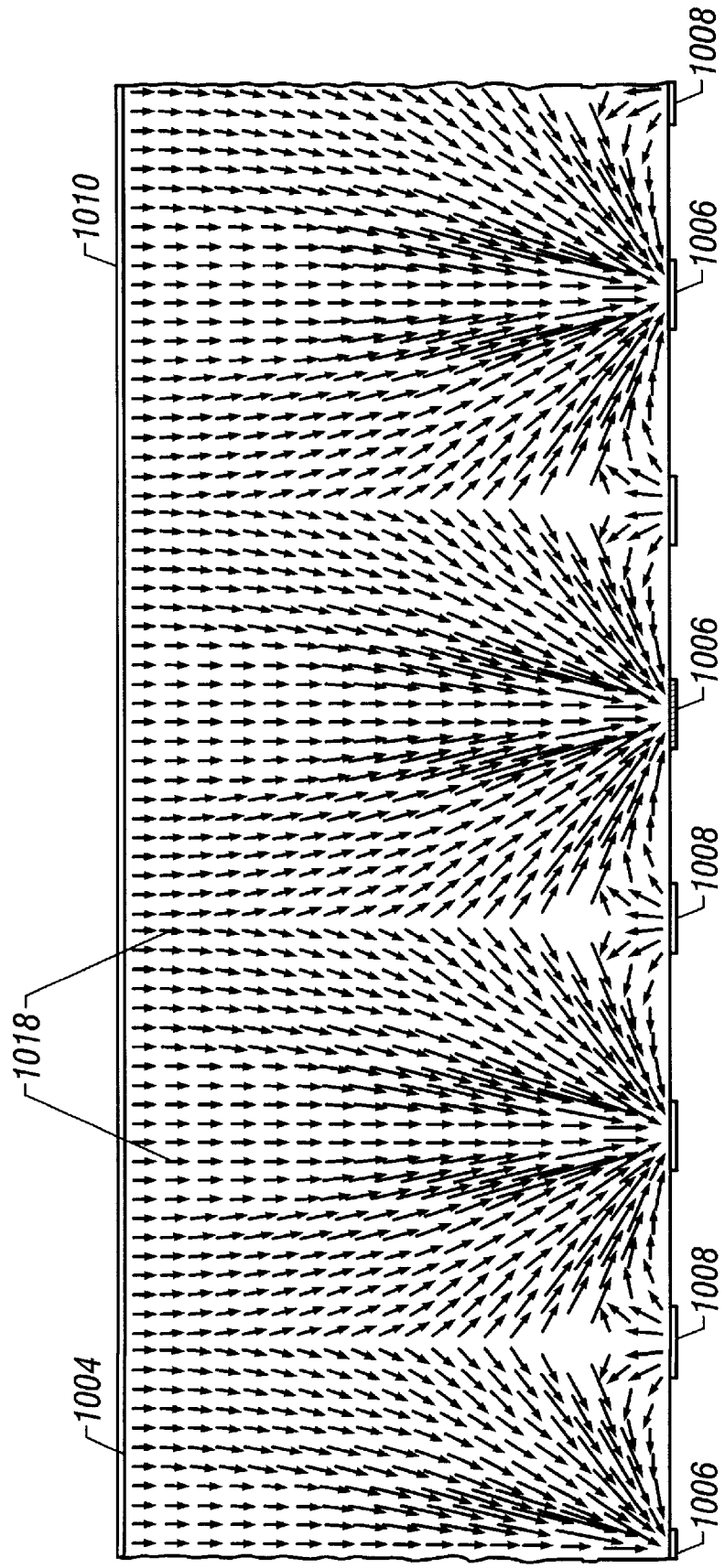
FIG. 10B is a cut-away side view of the array embodiment shown in FIG. 10A taken along line 10B—10B.

FIGS. 10A and 10B show an embodiment of a detector array 1000 in accordance with the invention. FIG. 10A is a perspective view of the detector array 1000. FIG. 10B is a cut-away side view of the detector array 1000 showing the electric field 1018 within the semiconductor crystal 1002.

A cathode 1004 is preferably formed to cover substantially all of one side 1010 of a semiconductor crystal 1002. The cathode 1004 need not fully cover such side 1010 of the crystal 1002, however, and may be nearly any size and shape desired (e.g., a square grid). The semiconductor crystal 1002 is substantially similar to the crystal 502 described above for the single-element detector 500 of FIG. 5A, with the exception that it may have a larger surface area on the electrode sides 1010, 1012 to accommodate an array of anodes 1006 and a control grid 1008. The crystal 1002 can be formed in a single block of monolithic or tiled semiconductor material.

The detector array 1000 is produced by replacing the single anode of a 3-electrode structure with a plurality of anodes 1006 and forming the control electrode 1008 as a grid within which the anodes 1006 are situated on the top side 1012 of the crystal 1002, as shown. Thus, each anode 1006 and its surrounding section of the control grid 1008 forms a pixel. The anodes 1006 and control grid 1008 can be formed using conventional semiconductor processing techniques. Such pixel arrays are particularly useful for radiation cameras, such as are used in industrial and medical applications.

In addition to the advantages of reducing low-energy tailing and improving resolution and collection efficiency, the detector array structure of the invention, as illustrated in FIG. 10B, establishes an electric field pattern 1018 that isolates each pixel from its neighbor, thereby suppressing cross-talk. Further, because the anodes 1006 can be made much smaller than the control grid 1008, substantial separation can be achieved between the anodes 1006 and control grid 1008. This has the effect of reducing inter-grid leakage current, which can be a source of unwanted noise in detector array devices.

The detector array 1000 operates under the same principles described above with respect to the various embodiments of the 3-electrode single-element detector. Thus, the control grid 1008 and the anodes 1006 share the charge induced by electron clouds, but, because the control grid 1008 is much larger than the anodes 1006, low-energy tailing is mostly eliminated from the anodes 1006. In addition, the control grid 1008 is preferably set at a voltage level $V_c$ that lies near the voltage level $V_b$ of the cathode 1004. Again, for the detector array 1000, the following voltage relationship exists: $V_c < V_a$. As noted above, this relationship acts to shape the electric field 1018 into field paths that guide the electron clouds toward the anodes 1006. In consequence, the electron clouds induce their full charge on the small anodes 1006. The result is a significant reduction in low-energy tailing for all the anode elements 1006 of the detector array 1000.

Although a single control grid 1008 is shown, zone control grids could be formed to control zones or subsets of the anodes 1006, or a control grid could be formed for each anode.

In one experimental unit fabricated as an array, a plurality of 3 mm×3 square pixel detectors were formed by patterning a control grid and centered anodes on a suitable semiconductor crystal (CdZnTe). Such an array is well suited for use in an imager for nuclear medicine.

All or some of the anodes 1006 may be connected together electrically in parallel. As a result, the structure of FIG. 10A can be used to produce single detectors of much larger area than would be possible with a single anode. In addition, such large area detectors have low overall capacitance, allowing the detector 1000 to have high sensitivity proportional to its area or volume and to have high resolution similar to smaller detectors.

One useful embodiment is a configuration similar to FIG. 10A but with all of the anodes 1006 connected together (either by wire or through logic circuitry) to the same measurement circuit. Such a configuration provides a large-area, high-sensitivity radiation detector with the good energy resolution of a much smaller device. The invention eliminates or significantly reduces effects of trapped charge from the signal, thus eliminating low-energy tailing due to hole trapping. However, when such a radiation detector gets large, the path lengths for electron collection at the anodes 1006 become significant. If the mean-free path for electrons is high enough that essentially all electrons are collected at the anodes 1006, the full electron charge is seen at the anodes 1006 for each gamma-ray-absorption event. However, if the path lengths are appreciable with respect to the mean-free path, only part of the electron charge will be measured and the portion measured will vary with path length, yielding a broadened peak in the energy spectra. Segmenting the radiation detector into smaller response areas and connecting the anodes 1006 together reduces the peak broadening due to electron trapping.

Another advantage of such a configuration occurs when multiple detector modules of the type shown in FIG. 10A are "tiled" together to form a larger detector array. An example of such tiling is shown in U.S. patent application Ser. No. 08/372,807, entitled "Semiconductor Gamma-ray Camera And Medical Imaging System", assigned to the assignee of the present invention, which is hereby incorporated by reference.

The anodes 1006 of each module can be logically combined so that each module in effect becomes a single "big pixel". If the signals of groups of detector elements within a module are combined, the number of effective pixels in the array decreases and the size of each pixel increases. In doing so, the efficiency of each "pixel" increases (there are many detector elements contributing to the signal) and the spatial resolution decreases (there are fewer pixels). For example, individual 8×8-detector-element modules could be tiled into a 7×9 array of modules. If each detector element were 1 mm×1 mm in size, the detector would then have 56 mm×72 mm resolution at maximum pixel sensitivity (i.e., all modules combined into a single "giant" pixel), 8 mm×8 mm resolution at "medium" pixel sensitivity (i.e., each detector module being a single pixel), and 1 mm×1 mm resolution at minimum pixel sensitivity (i.e., each detector element of each module being a pixel).

This arrangement allows the detector array to be used in a "rapid scan" mode of few, sensitive pixels to locate a region of interest at low resolution. The detector elements of the modules in the array can then be separately measured to view the region of interest with many lower sensitivity pixels but at higher resolution, providing the ability to "zoom in" on the region.

Further, if detector elements are connected together through logic circuitry, each detector element may have its own signal-conditioning circuit, and the gains of the detector elements with their signal-conditioning circuits can be corrected before being combined. This can be important in order to eliminate variations in detector performance due to detector responses, lead lengths, cross-coupling effects, or circuit values that might lower the energy resolution of the combined signal.

(6) Cross-Strip Radiation Detectors

The invention can be used to enhance charge collection in various types of cross-strip detectors by providing a control electrode on the same side of a radiation detector on which the anode is located.

In cross-strip radiation detectors, the location of a detected photon is determined by identifying the intersection (s) of orthogonal strips that simultaneously provide a signal from the absorption of a photon in the detector. Cross-strip detectors typically have been made with orthogonal strips on opposing surfaces. The strips on the two surfaces have typically been of the same strip-width and spacing. Systems that have deviated from this configuration typically have done so because the same spatial resolution was not required in both directions.

Conventional cross-strip detectors exhibit charge loss from hole trapping that is manifest as spectral degradation and low-energy tailing in the measured energy spectra. This significantly reduces the photopeak efficiency for gamma-ray energies above about 30 KeV. Applying the concepts of the invention can significantly reduce these problems. In general, the invention is useful in any situation where a radiation detector in a cross-strip configuration may suffer from signal loss due to charge trapping. Described below are several cross-strip detector embodiments of the invention.

(A) Anode-Cathode Cross-Strip Detector

Figure 13A:
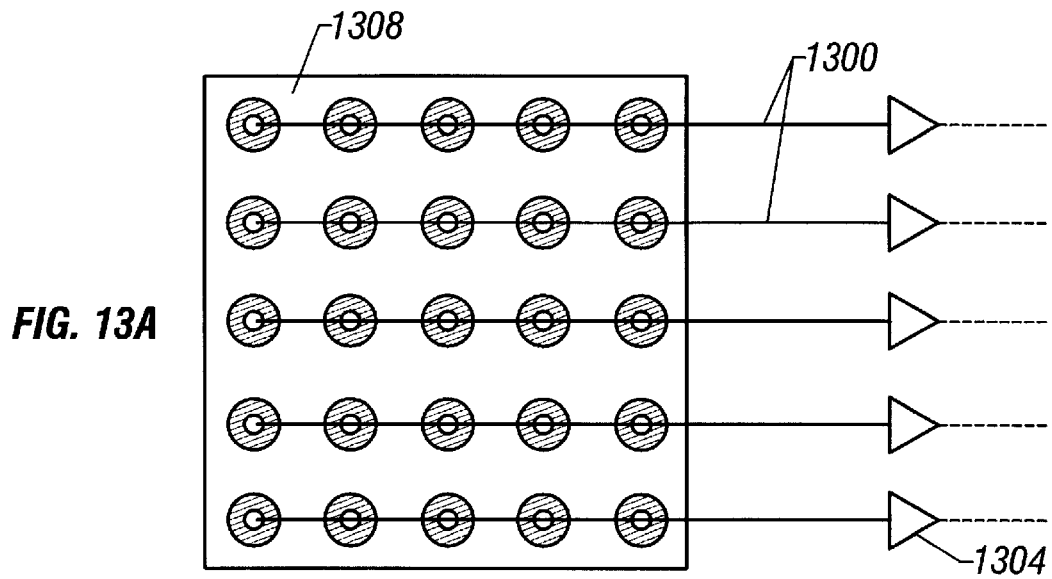
FIG. 13A is a top view of an embodiment of the invention with an anode pattern similar to the embodiment shown in FIG. 10A but configured as an anode-cathode cross-strip detector.
Figure 13B:
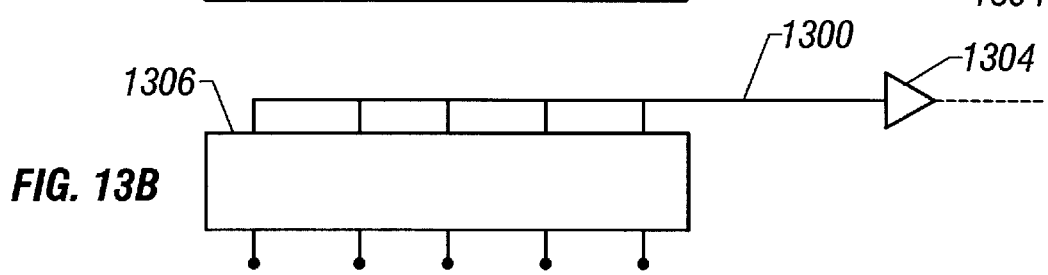
FIG. 13B is a side view of the embodiment shown in FIG. 13A.
Figure 13C:
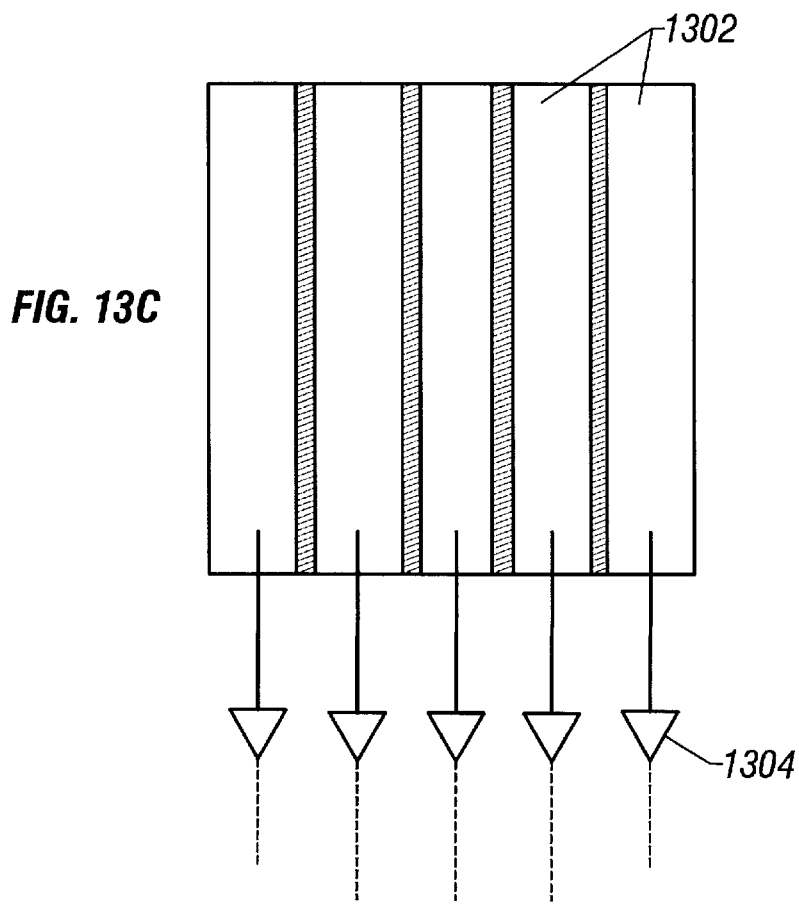
FIG. 13C is a bottom view of the embodiment shown in FIG. 13A.

FIGS. 13A, 13B, and 13C show an embodiment of the invention similar to the embodiment shown in FIG. 10A but configured as a simple anode-cathode cross-strip detector. FIG. 13A is a top view, FIG. 13B is a side view, and FIG. 13C is a bottom view. The anodes are connected in rows 1300. The cathode is formed into columns 1302 that are orthogonal to the anode rows 1300. Each row 1300 and column 1302 is coupled to amplification circuitry 1304 and measurement circuitry (not shown). A control electrode 1308 surrounds the anodes.

The benefits of this configuration include a reduction in the number of channels of electronics and finer spatial resolution than the pitch of the columns 1302. That is, spacial resolution on one side of the detector may be better than the other side with the same electrode-strip spacing. For example, while electrons are, in general, collected totally on one strip, trapped charge induces signal on all strips. The two or three strips nearest the trapped charge may have sufficient induced charge to be useable signals. Their relative magnitudes would provide finer spatial resolution than the pitch of the strips.

(B) Anode-Control Electrode Cross-Strip Detector

Figure 14A:
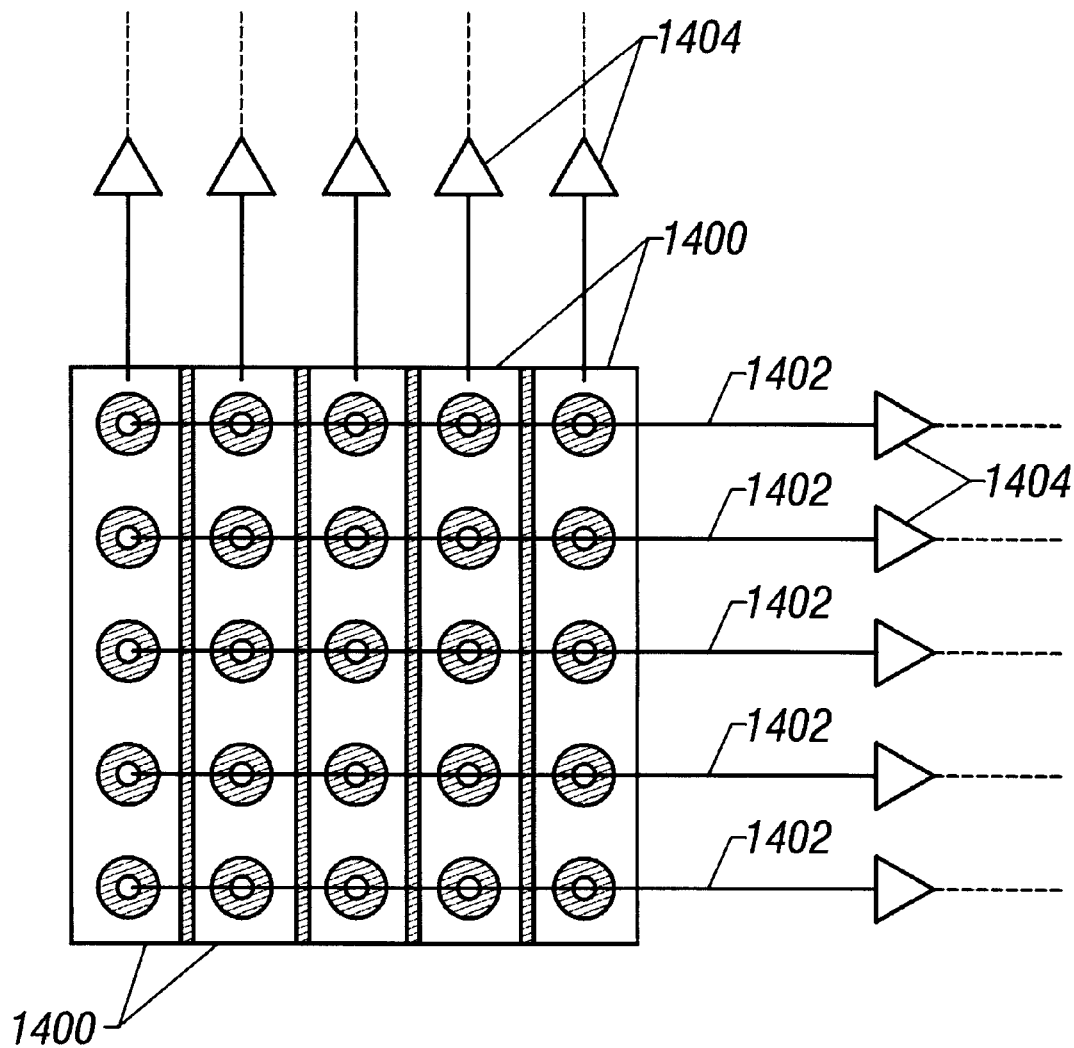
FIG. 14A is a top view of an embodiment of the invention similar to the embodiment shown in FIG. 10A but configured as an anode-control electrode cross-strip detector.
Figure 14B:
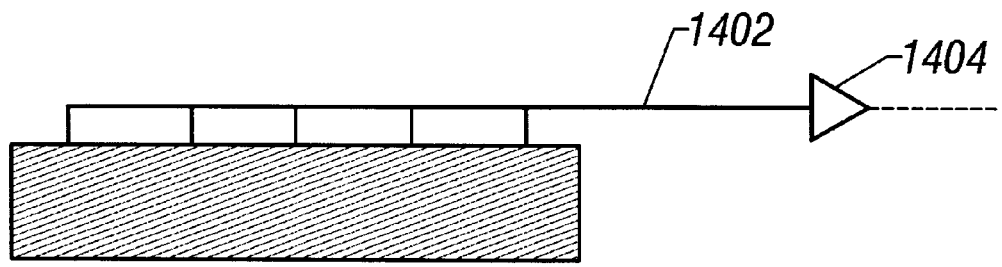
FIG. 14B is a side view of the embodiment shown in FIG. 14A.

FIGS. 14A and 14B show an embodiment of the invention similar to the embodiment shown in FIG. 10A but configured as a simple anode-control electrode cross-strip detector. FIG. 14A is a top view, and FIG. 14B is a side view. The control electrode is patterned into columns 1400, each encasing a column of anodes 1402. The anodes are connected in rows 1402 that are orthogonal to the control electrode columns 1400. Each column 1400 and row 1402 is coupled to amplification circuitry 1404 and measurement circuitry (not shown).

This configuration allows a reduction in electronic circuitry by measuring the signals from radiation absorption events with the anode rows 1402 and determining which anode(s) received the resultant charge cloud by measuring signals from the control electrode columns 1400. Further, this configuration allows both sets of signals to be on the same side of the detector, which has major significance in packaging and manufacturing a detection module so that it is "all-sides" buttable.

(C) Anode/Control Electrode-Cathode Cross-Strip Detector

Figure 15A:
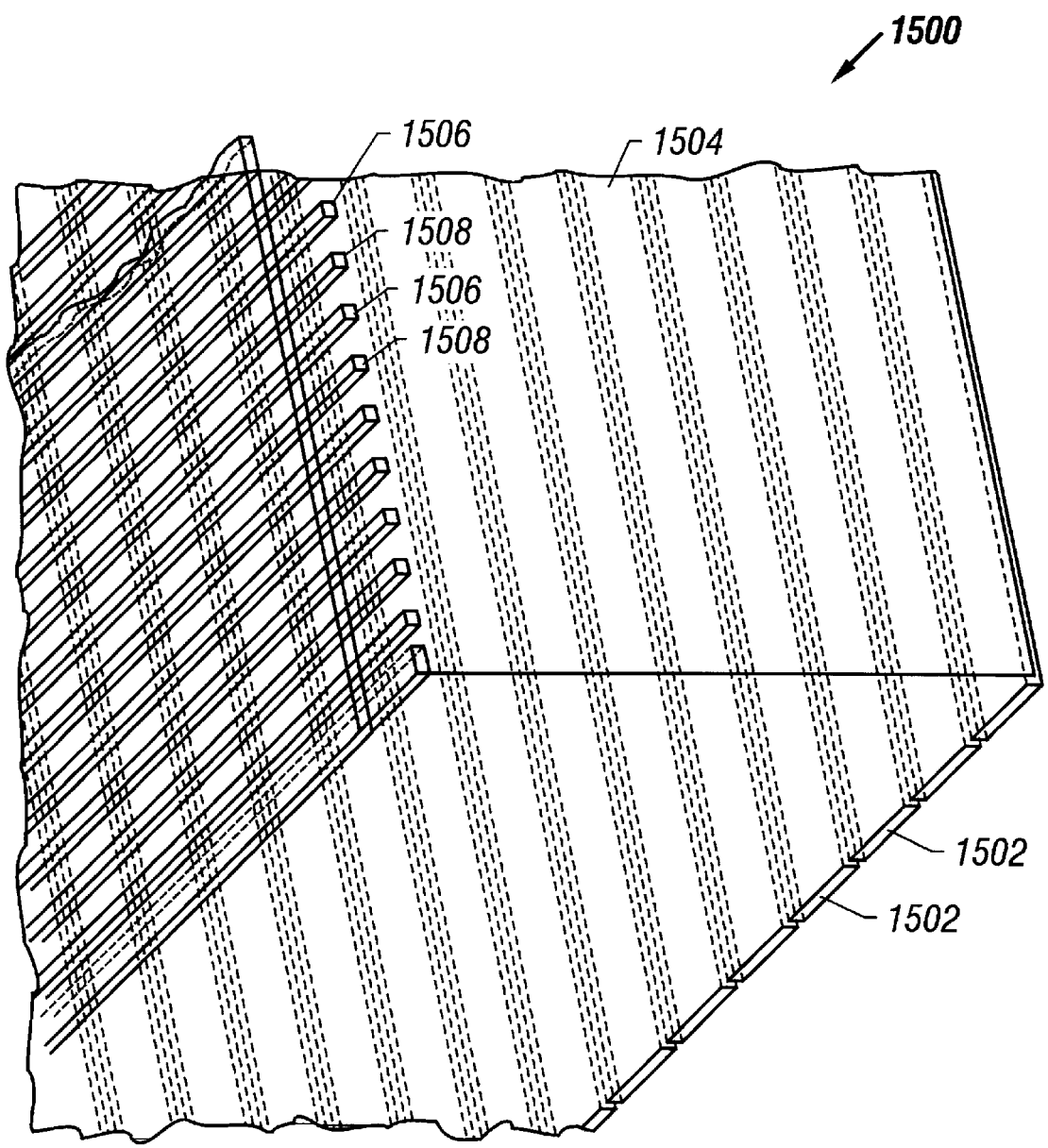
FIG. 15A is a top isometric view of an embodiment of the invention similar to the embodiment shown in FIG. 10A but configured as an anode-cathode cross-strip detector.
Figure 15B:
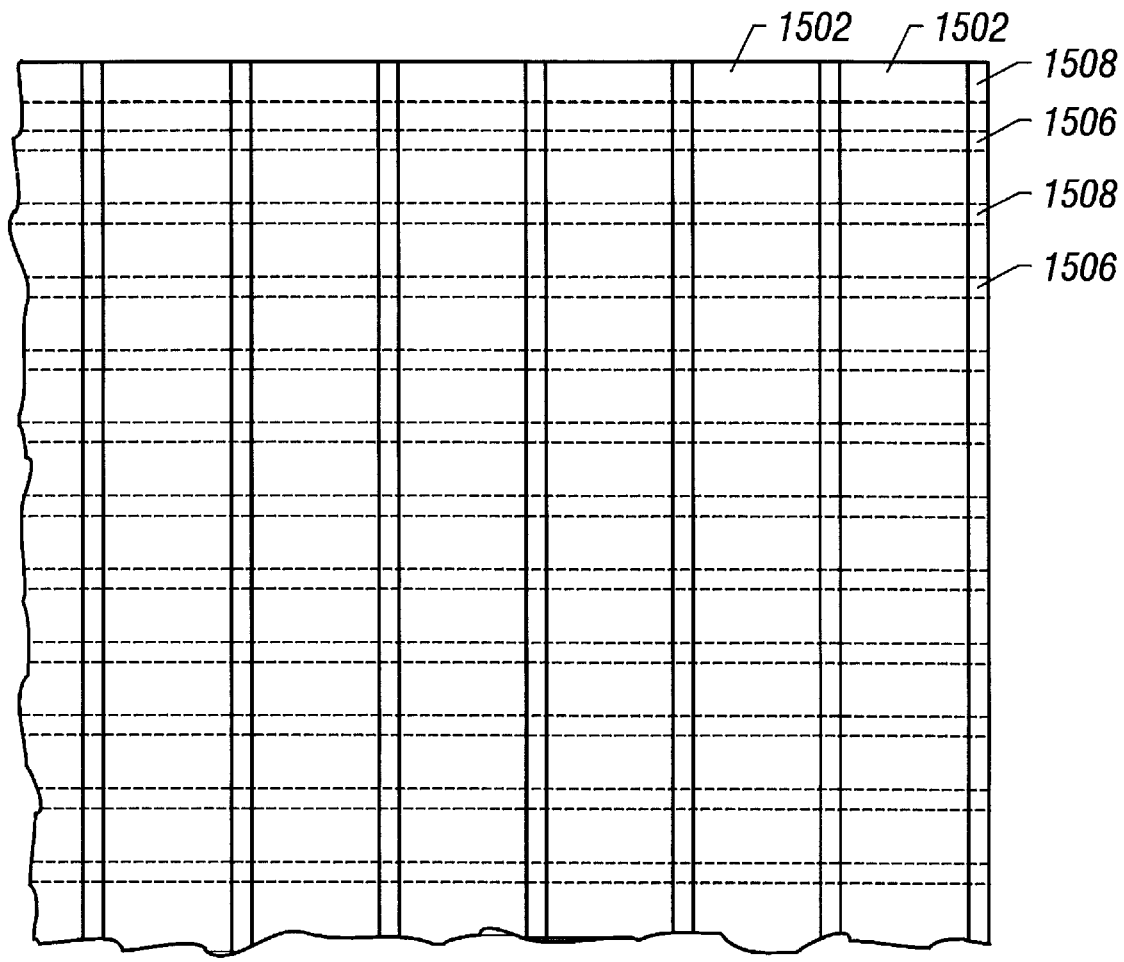
FIG. 15B is a bottom view of the embodiment shown in FIG. 15A.

FIG. 15A is a top isometric view of an embodiment of the invention similar to the embodiment shown in FIG. 10A but configured as an anode/control electrode-cathode cross-strip detector. FIG. 15B is a bottom view of the embodiment shown in FIG. 15A. In the illustrated embodiment, the detector 1500 includes a plurality of parallel cathode strips 1502 on one surface of a semiconductor crystal 1504, and a plurality of alternating or interdigitated anode strips 1506 and control electrode strips 1508 on the opposite surface of the semiconductor crystal 1504, orthogonal to the cathode strips 1502.

In a radiation imaging system, the anode signals from the anode strips 1506 are used to identify both incident radiation energy and the anode strip 1506 on which the electron signal is collected. The cathode signals from the cathode strips 1502 are used only to identify the orthogonal position of the radiation interaction. The only requirement for the cathode signals is that they be large enough to be distinguished above noise levels.

By making the cathode strips 1502 wide and the anode strips 1506 narrow, the relative capacitances from the point of interaction of a radiation event in the detector 1500 to the anode strips 1506 can be minimized and to the cathode strips 1502 can be maximized. This results in an electron charge signal at the anode strips 1506 that has minimum charge loss from trapped holes, and in a hole charge signal at the cathode strips 1502 that is maximized because the trapped-hole charge induced on the anode strips 1506 has been minimized and is, therefore, induced on the cathode strips 1502.

As in the embodiments of the invention described above, the control electrode strips 1508 placed between the anodes enhance electron collection by the anode strips 1506. The width of the control electrode strips 1508 is kept small for optimum separation of detection rows. A detection row is the volume of detector material between planes orthogonal to the cathode side of the detector and passing through the center lines of consecutive control electrode strips. Optionally, capacitance on the anode side of the detector for shielding trapped charge from being induced on the anode can be provided by a planar electrode 1510 that is as close as possible to—but insulated from—the surface of the detector. Such a structure is essentially the same as the fourth control electrode 1210 shown in FIG. 12B. The planar electrode may be connected to the control electrodes or to ground directly or through coupling capacitance. In one embodiment, the planar electrode 1510 can be provided with openings through which the anodes 1506, electrically isolated from the planar electrode 1510, can be coupled to measurement circuitry. Alternatively, contacts can be made to the anodes at one end of the anode structures.

The planar-electrode capacitance 1510 enhances the elimination of anode-signal-charge loss that results from trapped charge, but also reduces somewhat the signal at the cathode strips 1502. However, the benefits from enhancing the anode signal more than offset any disadvantage from degrading the cathode signals.

Preferred embodiments of cross-strip radiation detectors made in accordance with the invention typically follow the following general rules:

1. Anode strips should be as narrow as can be reliably manufactured with high strip conductivity.
2. Cathode strips should be as wide as can be reliably manufactured with good resistance between strips.
3. An interleaved set of control strips on the anode side should be as narrow as can be reliably manufactured.
4. A capacitance plane, tightly coupled to the detector and covering the areas between the anode strips and the control-electrode strips should be reliably connected to the control strips or to circuit ground, either directly or through a coupling capacitance.
5. The control strips should be connected to the control voltage supply with very low resistance to eliminate signal coupling into the anode strips.
6. The anode strips should be connected to preamplifiers with very low resistance to eliminate charge coupling into other electrodes or conductors.
7. The cathode strips should be connected to preamplifiers via a coupling capacitor with very low series resistance.

(7) Side-Entry Radiation Detector

Figure 16:
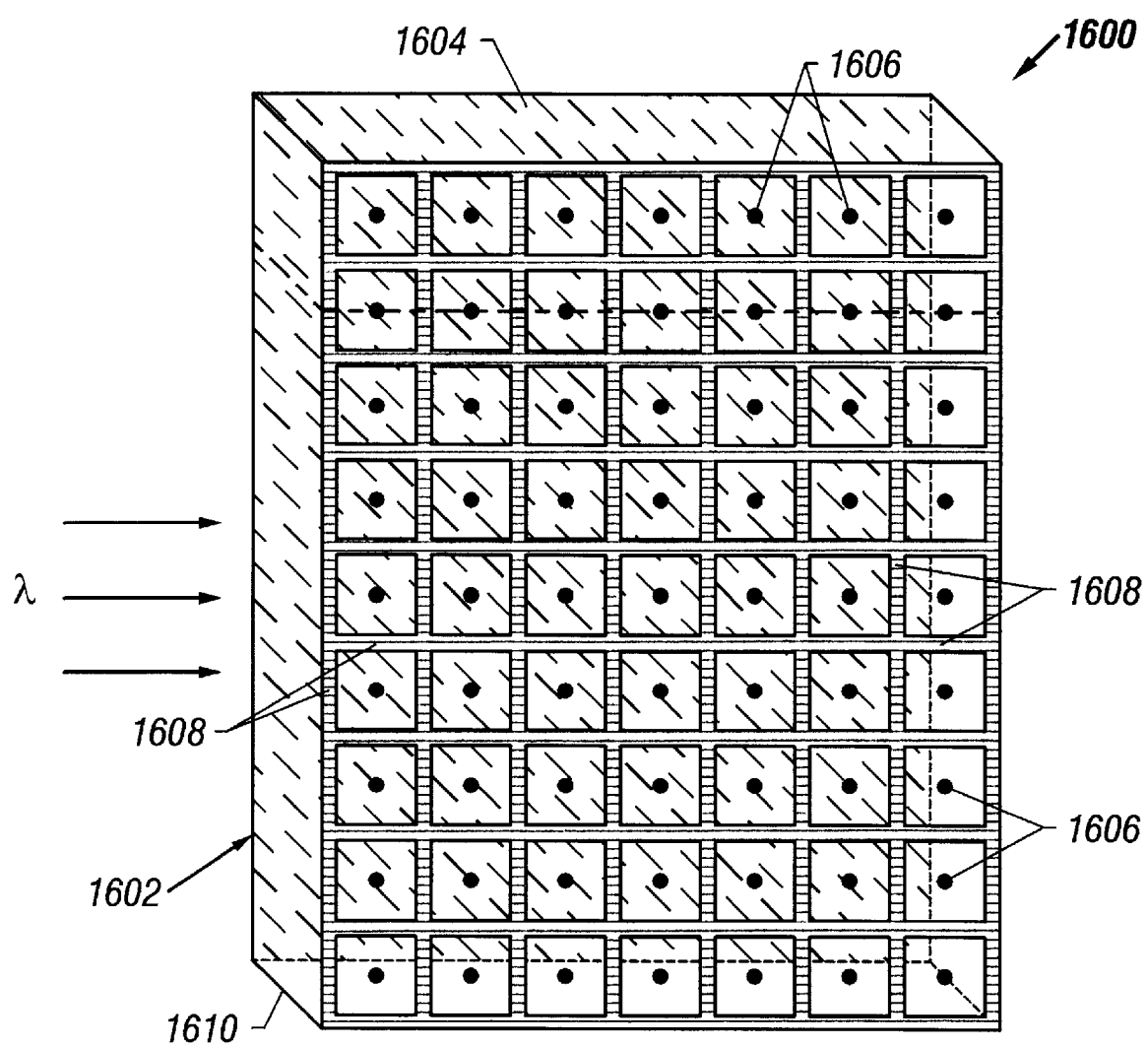
FIG. 16 is a perspective view of an alternative embodiment of the invention showing a side-entry radiation detector array structure.

FIG. 16 is a perspective view of an alternative embodiment of the invention showing a side-entry radiation detector array structure. The structure is essentially identical to the embodiment shown in FIG. 10A. However, in this embodiment, radiation enters the detector 1600 from an "illumination" side 1602, parallel to the cathode 1604 surface and anode 1606/control electrode 1608 surface, rather than through the cathode 1604. This configuration allows high detection efficiency of high energy gamma rays while permitting dimensions from anode 1606 to cathode 1604 that are smaller than would be otherwise required for such high energy gamma rays. For example, the anode-to-cathode thickness for the embodiment shown in FIG. 10A required to absorb very high energy gamma rays may require a bias voltage sufficiently high so as to cause pulse breakdown noise to be generated between conductors, or the thickness may be so great that electron-charge trapping may significantly degrade energy resolution. However, by using a side-entry embodiment, any desired depth of penetration can be achieved while allowing an optimum anode-to-cathode thickness.

The signals at the anodes 1606 can be individually measured by electronic circuitry, or the anodes 1606 can be tied together to form one or more "big pixel" detection elements. If the anodes 1606 are connected together in the direction of the incoming radiation, all of the events collected by a group of anodes 1606 can be measured with a single channel of electronics, reducing the cost of such a detector.

Another advantage of the side-entry radiation detector array structure is that if the anodes 1606 are measured individually or are connected together in a pattern orthogonal to the direction of the incoming radiation, the depth of interaction of the radiation within the semiconductor crystal 1610 can also be measured. As noted above in discussing measuring depth of interaction using timing information, measurement of depth of interaction is important for such applications as image reconstruction with coded masks or positron emission tomography.

(8) Liquid/Gas Ionization Detectors

The principles of the invention are also applicable to other types of detectors, such as liquid ionization detectors and gas ionization detectors. Semiconductor radiation detectors of the type described above are just one member of a class of radiation detectors known as ionization detectors. In such detectors, radiation is absorbed in an appropriate radiation interaction material to produce mobile electric charges which are collected by electrodes, thereby producing electrical output signals. In addition to semiconductor materials, the radiation interaction material may be a solid insulator (which can be considered as semiconductors with very wide bandgaps), a liquid, or a gas.

Liquid and gas ionization detectors (also known as ionization gauges) have been commercially available for many years and are widely used in nuclear technology. Such detectors essentially comprise an enclosed liquid or gaseous substance and two electrodes, the cathode and anode. Gamma rays or x-rays absorbed in the gas produce electrons and positive ions which, when a bias voltage is applied, sweep to the anode and cathode, respectively. Thus, while conceptually analogous to a semiconductor radiation detector, a central difference is that positive charge is carried by positive ions instead of holes.

Charge carrier trapping is generally not an issue in ionization gauges as it is in semiconductor detectors. However, because of their large mass, the ions travel very slowly and generally take several milliseconds to reach the cathode (compared to microseconds for electrons to reach the anode). When, as is often the case, the average time between absorbed photons is less than the ion transit time, "pulse pileup" results. To reduce or eliminate pulse pileup, electronic shaping circuitry may be applied that effectively cancels much or all of the contribution to the output pulse from the positive ions.

However, with the loss of the contribution from the positive ions, the magnitude of the output charge becomes dependent on the position within gauge at which the electrons are produced, i.e., the position of the radiation event. This dependence of the output pulse on position of the radiation event causes tailing in the energy distribution spectrum similar to the tailing seen with planar semiconductor detectors.

One solution to the tailing problem employed in ion gauges is the well-known Frisch grid (O. Frisch British Atomic Energy Report BR-49 (1944); G. F. Knoll, Radiation Detection and Measurement (John Wiley & Sons, N.Y., 1979), pp. 178–9). The Frisch grid consists of a screen grid placed between the cathode and anode that is biased to a voltage intermediate between the cathode and anode. The grid screens the electric field between electrons and the anode when the electrons are in the region between the grid and the cathode, but is effectively transparent to electrons. Electrons generated in the region between the grid and the cathode are swept through the grid to the anode, but do not begin inducing charge on the anode until they pass the grid. Thus, the effective "event position" for such electrons becomes that of the grid, which is the same for all such electrons.

Problems with the Frisch grid include:

Radiation events can occur in the region between the grid and the anode and contribute to tailing. Thus, to completely eliminate tailing from the output, the ionization gauge must be specially configured to prevent gamma rays from entering the grid-anode space. This complicates and increases the cost of operation as well as reducing overall collection efficiency.

The grid can never be completely transparent to electrons. It therefore further reduces efficiency by collecting some fraction of electrons.

The inclusion of the grid adds significantly to the overall manufacturing cost of the ionization gauge.

Figure 17:
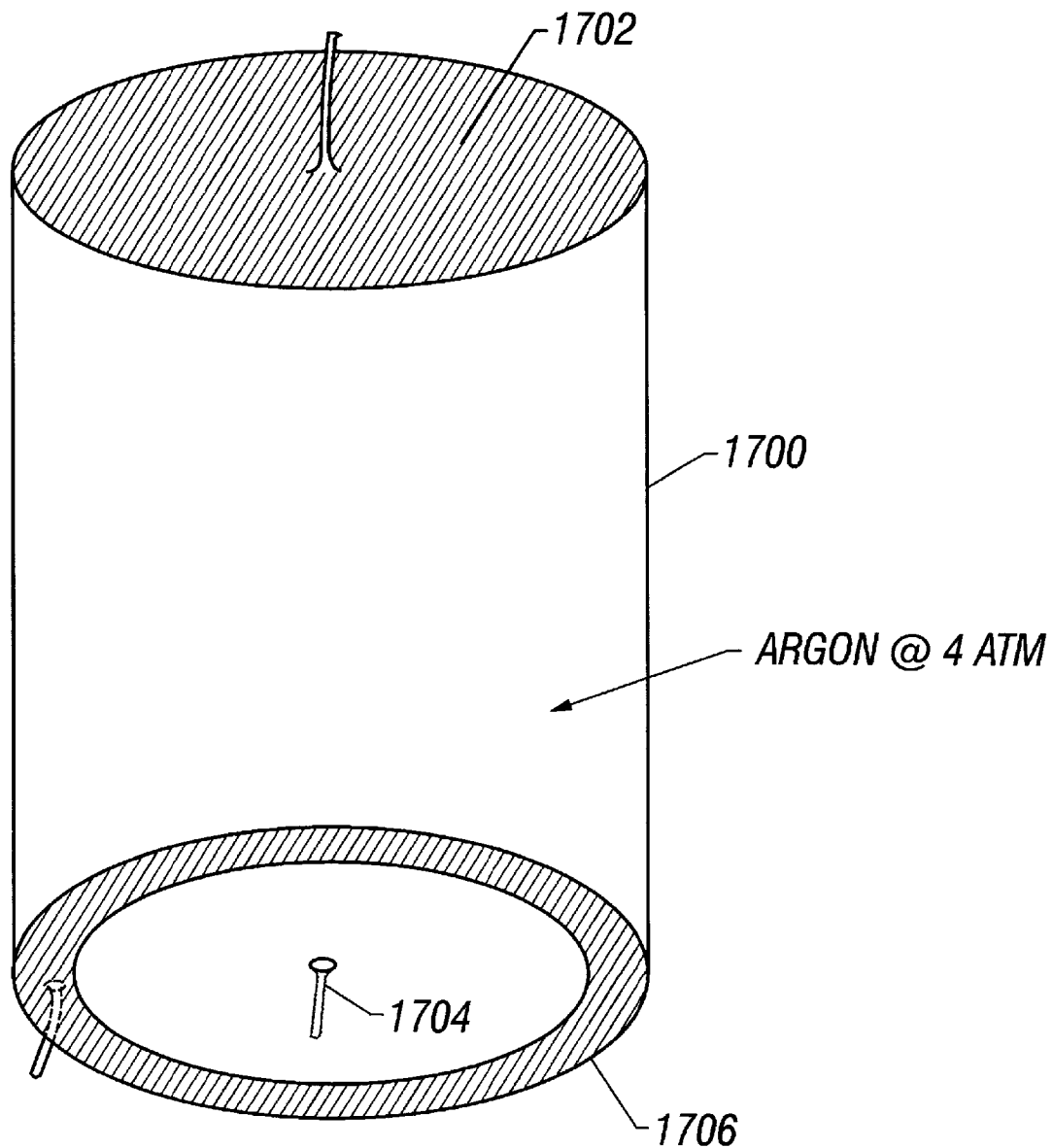
FIG. 17 shows an embodiment of the invention in the form of an ionization gauge.

These problems may be overcome by applying the concepts described above for semiconductor radiation detectors. FIG. 17 shows an embodiment of the invention in the form of an ionization gauge. In the illustrated embodiment, a closed chamber 1700, which may be made from glass, includes a cathode 1702 covering the inner surface of one end, an anode 1704 covering a very small area on the inner surface of the other end, and a control electrode 1706 on an inner surface surrounding the anode 1704. A gas, such as argon at about 4 atmospheres, fills the interior of the chamber 1700. External leads connect to the electrodes through conventional glass-metal seals.

Alternative ways of implementing an ionization gauge include: all three electrodes may be wires internal to a glass enclosure that contains the gas; one or more of the electrodes may consist of coatings on a glass containment vessel (with the control electrode(s) on the internal or external surface); the cathode may constitute a wall of the containment structure; other gases may be used; liquids may be used; other shapes may be used; multiple electrodes of any of the three types may be used.

As in the semiconductor radiation detectors described above, the control electrode 1706 serves to focus the electric field. The small size of the anode 1704 and the field focusing action of the control electrode 1706 eliminate tailing in the same manner as they do in a semiconductor device. The same principles apply except that the performance limiting factor is a difference in mobilities between electrons and ions instead of a $\mu\tau$ product difference between electrons and holes. Such a detector is less costly to produce than a Frisch grid and is applicable in configurations where a Frisch grid cannot be effected.

(9) Conclusion

An essential feature of the invention is to employ a combination of control electrode(s), anode(s) and cathode(s) in such a way that essentially the fill electron charge from a radiation absorption event is collected at the anode, while the effects of hole trapping or loss of positive ion signal are shielded from the anode and most low-energy tailing is eliminated from the signal. The electrodes are also configured so as to form an electric field pattern within the detector that directs electron clouds produced by ionizing radiation efficiently to the anode(s).

A number of embodiments of the invention have been described. Nevertheless, it will be understood that various modifications may be made without departing from the spirit and scope of the invention. For example, different independent aspects of the various embodiments described above may be combined into new embodiments. As one example, shielding control electrodes can be added to the embodiments shown in FIGS. 13–17. As another example, supplemental shielding control electrodes can be added to such combinations of shielding control electrodes and the embodiments shown in FIGS. 13–17. Accordingly, it is to be understood that the invention is not to be limited by the specific illustrated embodiment, but only by the scope of the appended claims.

What is claimed is:

1. A radiation detector, comprising:
   (a) a semiconductor having a plurality of sides and of sufficient thickness to interact with ionizing radiation;
   (b) at least one bias electrode formed on at least one side of the semiconductor;
   (c) at least one signal electrode formed on at least one side of the semiconductor;
   (d) at least one focus control electrode, formed on at least one side of the semiconductor and having a first potential, for directing charge clouds resulting from ionizing events in the semiconductor towards an associated signal electrode; and
   (e) at least one shield control electrode, formed on at least one side of the semiconductor near each signal electrode and having a second potential, for reducing the effect on an associated signal electrode of charge induced by trapped charges in the semiconductor.

2. The radiation detector of claim 1, wherein the shield control electrode is electrically insulated from, but capacitively coupled to, the semiconductor.

3. The radiation detector of claim 1, wherein second potential is the same as the first potential.

4. The radiation detector of claim 1, wherein second potential is different from the first potential.

5. A radiation detector, comprising:
   (a) a semiconductor having a plurality of sides and of sufficient thickness to interact with ionizing radiation;
   (b) at least one bias electrode formed on at least one side of the semiconductor;
   (c) at least one signal electrode formed on at least one side of the semiconductor;
   (d) at least one focus control electrode, formed on at least one side of the semiconductor and having a first potential, for directing charge clouds resulting from ionizing events in the semiconductor towards an associated signal electrode; and
   (e) at least one shield control electrode, formed on at least one side of the semiconductor near the signal electrode and having a second potential, for reducing the effect on an associated signal electrode of charge induced by trapped charges in the semiconductor; and
   (f) at least one supplemental shielding control electrode, formed on at least one side of the semiconductor and having a third potential, for reducing the effect on an associated signal electrode of charge induced by trapped charges in the semiconductor.

6. The radiation detector of claim 5, wherein the shield control electrode is electrically insulated from, but capacitively coupled to, the semiconductor.

7. The radiation detector of claim 5, wherein at least one supplemental shield control electrode is electrically insulated from, but capacitively coupled to, the semiconductor.

8. The radiation detector of claim 5, wherein at least two of the first potential, second potential, and third potential are different.

9. A cross-strip radiation detector, comprising:
   (a) a semiconductor having a plurality of sides and of sufficient thickness to interact with ionizing radiation;
   (b) at least one independent parallel strip bias electrode formed on at least one side of the semiconductor;
   (c) a plurality of signal electrodes formed on at least one side of the semiconductor and intercoupled as at least two independent signal strips effectively orthogonal to the parallel strip bias electrodes, each signal strip including one or more electrically coupled signal electrodes; and
   (d) at least one control electrode, formed on at least one side of the semiconductor, for performing at least one of the functions of (A) directing charge clouds resulting from ionizing events in the semiconductor towards the signal electrode and (B) substantially reducing the effect on the signal electrode of hole trapping in the semiconductor.

10. The cross-strip radiation detector of claim 9, wherein a position for an ionizing event can be determined from measuring signals on the independent signal strips and the parallel strip bias electrodes.

11. A cross-strip radiation detector, comprising:
    (a) a semiconductor having a plurality of sides and of sufficient thickness to interact with ionizing radiation;
    (b) at least one bias electrode formed on at least one side of the semiconductor;
    (c) a plurality of signal electrodes formed on at least one side of the semiconductor and intercoupled as at least two independent signal strips, each signal strip including one or more electrically coupled signal electrodes; and
    (d) a plurality of independent parallel strip control electrodes, formed on at least one side of the semiconductor near the signal electrodes and effectively orthogonal to the signal strips, for performing at least one of the functions of (A) directing charge clouds resulting from ionizing events in the semiconductor towards the signal electrode and (B) substantially reducing the effect on the signal electrode of hole trapping in the semiconductor.

12. The cross-strip radiation detector of claim 11, wherein a position for an ionizing event can be determined from measuring signals on the independent signal strips and the independent parallel strip control electrodes.

13. The cross-strip radiation detector of claim 11, wherein a radiation detection measurement signal is taken from the independent parallel strip control electrodes.

14. A cross-strip radiation detector, comprising:
    (a) a semiconductor having a plurality of sides and of sufficient thickness to interact with ionizing radiation;
    (b) at least one independent parallel strip bias electrode formed on at least one side of the semiconductor;
    (c) a plurality of independent parallel strip signal electrodes formed on at least one side of the semiconductor effectively orthogonal to the parallel strip bias electrodes; and
    (d) a plurality of parallel strip control electrodes, formed on at least one side of the semiconductor near and interdigitated with the parallel strip signal electrodes, for performing at least one of the functions of (A) directing charge clouds resulting from ionizing events in the semiconductor towards the signal electrode and (B) substantially reducing the effect on the signal electrode of hole trapping in the semiconductor.

15. The cross-strip radiation detector of claim 14, wherein a position for an ionizing event can be determined from measuring signals on the independent parallel signal strips and the independent parallel strip bias electrodes.

16. A radiation detector, comprising:
    (a) a semiconductor having a plurality of sides and of sufficient thickness to interact with ionizing radiation;
    (b) at least one bias electrode formed on at least one side of the semiconductor;
    (c) a plurality of signal electrodes formed on at least one side of the semiconductor and interconnected as at least two independent signal elements, each signal element including one or more electrically coupled signal electrodes; and (d) at least one control electrode, formed on at least one side of the semiconductor near the signal electrodes, for directing charge clouds resulting from ionizing events in the semiconductor towards the signal electrodes and for substantially reducing the effect on the signal electrodes of hole trapping in the semiconductor.

17. The radiation detector of claim 16, further including means for varying the number and effective size of each independent signal element by varying the number of interconnected signal electrodes included in each independent signal element, wherein the spatial resolution and efficiency of the radiation detector is a function of the number and size of the independent signal elements.

18. A radiation detector, comprising:

(a) a semiconductor having a plurality of sides and of sufficient thickness to interact with ionizing radiation, the semiconductor having a radiation illumination surface;

(b) at least one bias electrode formed on at least one side of the semiconductor orthogonal to the illumination surface;

(c) at least one signal electrode formed on at least one side of the semiconductor orthogonal to the illumination surface; and (d) at least one control electrode, formed on at least one side of the semiconductor, for performing at least one of the functions of (A) directing charge clouds resulting from ionizing events in the semiconductor towards the signal electrode and (B) substantially reducing the effect on the signal electrode of hole trapping in the semiconductor.

19. The radiation detector of claim 18, further including means for determining the depth of interaction of ionizing events in the semiconductor.

20. The radiation detector of claim 18, further including means for determining the position of interaction of ionizing events in the semiconductor.

21. An ionization chamber, comprising:

(a) a chamber enclosing a radiation interaction material comprising one of a liquid or a gas, the chamber having a plurality of sides;

(b) at least one bias electrode formed on at least one side of the chamber;

(c) at least one a signal electrode formed on at least one side of the chamber; and (d) at least one control electrode, formed on at least one side of the chamber, for directing charge resulting from ionizing events in the radiation interaction material towards the signal electrode and for substantially reducing the effect on the signal electrode of non-collected ions of an opposite polarity to such charge.

22. A method for determining timing information for a radiation detector having a semiconductor having a plurality of sides and of sufficient thickness to interact with ionizing radiation; at least one bias electrode formed on at least one side of the semiconductor; at least one signal electrode formed on at least one side of the semiconductor; and at least one control electrode, formed on at least one side of the semiconductor for performing at least one of the functions of (A) directing charge clouds resulting from ionizing events in the semiconductor towards at least one signal electrode and (B) substantially reducing the effect on at least one signal electrode of hole trapping in the semiconductor, the method including the steps of:

(a) determining a first time measurement indicating when a signal measured from at least one of the bias electrodes or the control electrodes exceeds a first selected threshold;

(b) determining a second time measurement indicating when a signal on at least one signal electrode exceeds a second selected threshold;

(c) determining the difference between the first time measurement and the second time measurement.

23. The method of claim 22, further including the step of determining the depth of interaction of an ionizing event in the semiconductor from the determined difference between the first time measurement and the second time measurement.

24. A method for determining depth of interaction of an ionizing event in a radiation detector having a semiconductor having a plurality of sides and of sufficient thickness to interact with ionizing radiation; at least one bias electrode formed on at least one side of the semiconductor; at least one signal electrode formed on at least one side of the semiconductor; and at least one control electrode, formed on at least one side of the semiconductor for performing at least one of the functions of (A) directing charge clouds resulting from ionizing events in the semiconductor towards at least one signal electrode and (B) substantially reducing the effect on at least one signal electrode of hole trapping in the semiconductor, the method including the steps of:

(a) measuring a magnitude of charge signal, resulting from ionizing events in the semiconductor, on at least one of the bias electrodes, the control electrodes, or the signal electrodes; and (b) determining a relationship between depth of interaction of the ionizing event and a combination of the magnitudes of the measured charge signals.

25. A method as in claim 24, further comprising measuring another charge signal from another electrode different from the signal electrode and using a combination of the measured charge signal and another charge signal to determine the relationship.

26. A method as in claim 24, wherein the charge signal is measured from one of the bias electrodes.

* * * * *